US009671282B2

(12) United States Patent
Namba et al.

(10) Patent No.: US 9,671,282 B2
(45) Date of Patent: Jun. 6, 2017

(54) IMAGING DEVICE AND IMAGING METHOD HAVING AN ILLUMINANCE CALCULATION UNIT CALCULATING RESPECTIVE ILLUMINANCES CORRESPONDING TO DIGITAL SIGNALS

(71) Applicant: Sony Corporation, Tokyo (JP)

(72) Inventors: Kazuhide Namba, Kanagawa (JP); Youji Sakioka, Kanagawa (JP); Hiroaki Ebihara, Kanagawa (JP); Daisuke Yoshioka, Kanagawa (JP); Ryota Moriwaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 83 days.

(21) Appl. No.: 14/864,206

(22) Filed: Sep. 24, 2015

(65) Prior Publication Data
US 2016/0011042 A1   Jan. 14, 2016

Related U.S. Application Data

(63) Continuation of application No. 14/051,636, filed on Oct. 11, 2013, now Pat. No. 9,157,794.

(30) Foreign Application Priority Data

Nov. 7, 2012   (JP) ................. 2012-245034

(51) Int. Cl.
| | | |
|---|---|---|
| G01J 1/42 | (2006.01) | |
| H04N 5/235 | (2006.01) | |
| G03B 7/091 | (2006.01) | |
| H04N 5/355 | (2011.01) | |
| G01J 1/02 | (2006.01) | |

(Continued)

(52) U.S. Cl.
CPC .......... *G01J 1/4214* (2013.01); *G01J 1/0204* (2013.01); *G01J 1/4228* (2013.01); *G03B 7/091* (2013.01); *H04N 5/2256* (2013.01); *H04N 5/2353* (2013.01); *H04N 5/2355* (2013.01); *H04N 5/35581* (2013.01); *G01J 2001/0257* (2013.01); *G01J 2001/4426* (2013.01)

(58) Field of Classification Search
CPC ...... H04N 5/2256; H04N 5/335; H04N 5/343; H04N 5/2351
USPC .................. 250/205, 214 R, 208.1
See application file for complete search history.

(56) References Cited

U.S. PATENT DOCUMENTS

| | | | | |
|---|---|---|---|---|
| 7,286,215 B2 * | 10/2007 | Imura | ....... | G01J 1/08 356/213 |
| 8,908,065 B2 | 12/2014 | Oike | | |

FOREIGN PATENT DOCUMENTS

| | | |
|---|---|---|
| JP | 2002-300447 | 10/2002 |
| JP | 2003-110681 | 4/2003 |
| JP | 2008-042846 | 2/2008 |

\* cited by examiner

*Primary Examiner* — Que T Le
(74) *Attorney, Agent, or Firm* — Michael Best & Friedrich LLP

(57) ABSTRACT

An imaging device includes an exposure control unit, a determination unit, and an illuminance calculation unit. The exposure control unit is configured to control a plurality of exposure times. The determination unit is configured to determine whether or not saturation occurs using at least one data item of a plurality of data items obtained during the plurality of exposure times. The illuminance calculation unit is configured to calculate, if the determination unit deter- (Continued)

mines that the saturation occurs, an illuminance using a data item different from the at least one data item used in the determination.

11 Claims, 16 Drawing Sheets

(51) Int. Cl.
*H04N 5/225* (2006.01)
*G01J 1/44* (2006.01)

IMAGING DEVICE AND IMAGING METHOD HAVING AN ILLUMINANCE CALCULATION UNIT CALCULATING RESPECTIVE ILLUMINANCES CORRESPONDING TO DIGITAL SIGNALS

CROSS REFERENCE TO RELATED APPLICATIONS

This is a Continuation Application of U.S. application Ser. No. 14/051,636, filed Oct. 11, 2013, which claims priority to patent Application JP 2012-245034 filed Nov. 7, 2012, the entire contents of which are incorporated herein by reference.

BACKGROUND

The present disclosure relates to an imaging device and an imaging method. More particularly, the present disclosure relates to an imaging device and an imaging method that make it possible to calculate an illuminance with higher accuracy.

In recent years, miniaturization and higher functionality of a cellular phone, a digital camera, and the like are in progress. Power consumption increases due to the higher functionality, and hence measures are taken to achieve low power consumption. With the progress of miniaturization, measures are taken to achieve miniaturization of the battery or the like. In the cellular phone or the like, regarding the brightness of an LCD or key light, a high-luminance design is employed such that the LCD or the key light can be easily viewed also in a dark place. However, achieving high luminance increases power consumption. Therefore, a luminance sensor is provided. Based on a luminance data item determined by the illuminance sensor, the luminance of the LCD or the key light is adjusted to optimize the illuminance. In this way, a reduction of power consumption is achieved.

However, for this purpose, it is necessary to install an illuminance sensor into a terminal. A position at which the illuminance sensor is installed has to be suitable for illuminance measurement, and hence has a large constraint on mounting. Further, a design of a screen for receiving light is also necessary, and hence it becomes a constraint on not only mounting but also design. As techniques in the related art that are aimed to implement functions of an illuminance sensor and a camera module with small space, there are cellular phones disclosed in Japanese Patent Application Laid-open No. 2003-110681, Japanese Patent Application Laid-open No. 2008-042846, and Japanese Patent Application Laid-open No. 2002-300447 (hereinafter, referred to as Patent Documents 1, 2, and 3, respectively).

SUMMARY

As in the techniques described in Patent Documents 1 to 3, an illuminance can be detected based on a data item of a camera module. However, in illuminance detection for a single exposure time, illuminance calculation is performed also in a saturation state, for example, and hence it can be difficult to perform illuminance detection with high accuracy.

In view of the above-mentioned circumstances, it is desirable to perform illuminance detection with higher accuracy.

According to an embodiment of the present disclosure, there is provided an imaging device including: an exposure control unit configured to control a plurality of exposure times; a determination unit configured to determine whether or not saturation occurs using at least one data item of a plurality of data items obtained during the plurality of exposure times; and an illuminance calculation unit configured to calculate, if the determination unit determines that the saturation occurs, an illuminance using a data item different from the at least one data item used in the determination.

The determination unit may be configured to calculate an average value of the plurality of data items and determine, based on a comparison result between the average value and a threshold value, whether or not saturation occurs.

The determination unit may be configured to calculate an average value of data items obtained during a first exposure time and determines, if the average value is equal to or larger than a threshold value, that the saturation occurs, and the illuminance calculation unit may be configured to obtain, if the determination unit determines that the saturation occurs, a data item obtained during a second exposure time shorter than the first exposure time, and calculate an illuminance.

The imaging device may further include: a comparator configured to compare each of the plurality of data items with a first threshold value; and a count unit configured to count the number of comparison results of comparison results from the comparator, each of which satisfies a predetermined condition. The determination unit may be configured to determine, based on a comparison result between a count value of the count unit and a second threshold value, whether or not saturation occurs.

The imaging device may further include: a comparator configured to compare each of data items obtained during a first exposure time with a first threshold value; and a count unit configured to count the number of comparison results of comparison results from the comparator, in each of which the data item is equal to or larger than the first threshold value. The determination unit may be configured to determine, if a count value of the count unit is equal to or larger than a second threshold value, that the saturation occurs, and the illuminance calculation unit may be configured to obtain, if the determination unit determines that the saturation occurs, a data item obtained during a second exposure time shorter than the first exposure time, and calculate an illuminance.

The imaging device may further include: a comparator configured to compare each of the plurality of data items with a first threshold value; an output unit configured to output, as a comparison result from the comparator, codes each indicating a comparison result between the data item and the first threshold value; and a count unit configured to count the number of codes of the codes from the output unit, each of which satisfies a predetermined condition. The determination unit may be configured to determine, based on a comparison result between a count value of the count unit and a second threshold value, whether or not saturation occurs.

The imaging device may further include: a comparator configured to compare each of data items obtained during a first exposure time with a first threshold value; an output unit configured to output, as a comparison result from the comparator, codes each indicating whether or not the data item is equal to or larger than the first threshold value; and a count unit configured to count the number of codes of the codes from the output unit, each of which indicates that the data item is equal to or larger than the first threshold value. The determination unit may be configured to determine, if a count value of the count unit is equal to or larger than a second threshold value, that the saturation occurs, and the illuminance calculation unit may be configured to obtain, if the determination unit determines that the saturation occurs, a data item obtained during a second exposure time shorter than the first exposure time, and calculate an illuminance.

According to another embodiment of the present disclosure, there is provided an imaging method for an imaging device including an exposure control unit, a determination unit, and an illuminance calculation unit, the method including: controlling, by the exposure control unit, a plurality of exposure times; determining, by the determination unit, whether or not saturation occurs using at least one data item of a plurality of data items obtained during the plurality of exposure times; and calculating, by the illuminance calculation unit, if the determination unit determines that the saturation occurs, an illuminance using a data item different from the at least one data item used in the determination.

In the imaging apparatus and the imaging method according to the embodiments of the present disclosure, the plurality of exposure times are controlled, whether or not saturation occurs is determined using the at least one data item of the plurality of data items obtained during the plurality of exposure times, and, if it is determined that the saturation occurs, the illuminance is calculated using the data item different from the at least one data item used in the determination.

According to the embodiments of the present disclosure, it becomes possible to perform illuminance detection with higher accuracy.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out of the present disclosure (hereinafter, referred to as embodiments) will be described. Note that descriptions will be made in the following order.
1. First Embodiment
2. Second Embodiment
3. Third Embodiment
4. Fourth Embodiment
5. Application to Back Side Illumination
6. Configuration of Imaging Apparatus
7. Recording Medium

First Embodiment

Figure 1:
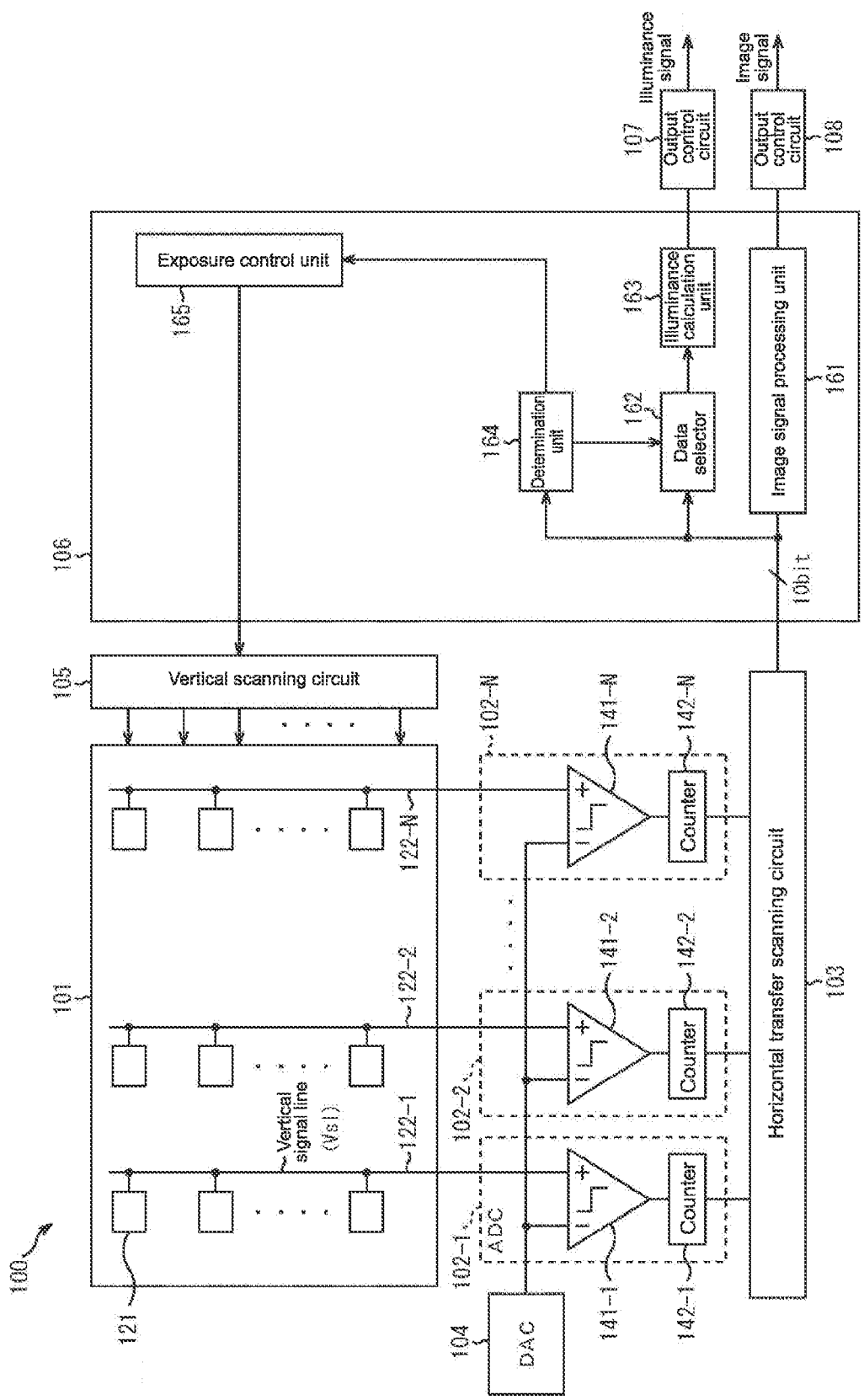
FIG. 1 is a diagram showing a configuration of a solid-state imaging device according to a first embodiment to which the present disclosure is applied.

FIG. 1 is a diagram showing a configuration of a solid-state imaging device 100 according to an embodiment to which the present disclosure is applied. Specifically, FIG. 1 is a block diagram showing an exemplary configuration of a column-parallel analog-to-digital converter (ADC)-installed solid-state imaging device (complementary metal-oxide semiconductor (CMOS) image sensor) used as the solid-state imaging device 100.

The solid-state imaging device 100 shown in FIG. 1 includes a pixel unit 101, an ADC 102, a horizontal transfer scanning circuit 103, a digital-to-analog converter (DAC) 104, a vertical scanning circuit 105, an arithmetic control unit 106, an output control circuit 107, and an output control circuit 108.

The pixel unit 101 includes unit pixels 121 arranged in a matrix form. Each of the unit pixels 121 includes a photodiode (photoelectric conversion element) and an amplifier in the pixel. Regarding the pixel unit 101, pixel driving lines (not shown) are formed for each row along left- and right-hand directions of the figure (arraying direction of pixels in pixel row) in the pixel arrangement in the matrix form, and vertical signal lines 122-1 to 122-N are formed for each column along in upper and lower directions of the figure (arraying direction of pixels in pixel column. Note that, in the following description, when it is unnecessary to distinguish between the vertical signal lines 122-1 to 122-N, the vertical signal lines 122-1 to 122-N will be simply referred to as vertical signal lines 122. The same will apply hereinafter.

The vertical scanning circuit 105 is a pixel drive unit that includes a shift register, an address decoder, and the like and drives pixels of the pixel unit 101, for example, at the same time or on the row basis. Although an illustration of a specific configuration of the vertical scanning circuit 105 is omitted, the vertical scanning circuit 105 includes a read-scanning system and a sweep-scanning system or includes a configuration having a batch sweep function and a batch transfer function.

Pixel signals output from unit pixels of a pixel row selected and scanned by the vertical scanning circuit 105 are supplied to ADCs 102-1 to 102-N through the vertical signal lines 122-1 to 122-N, respectively. The ADC 102 performs, for each pixel column of the pixel unit 101, predetermined signal processing on pixel signals output from unit pixels in a selected row through the vertical signal line 122. The processed pixel signals are supplied to the horizontal transfer scanning circuit 103. The processing in the ADC 102 will be described later with reference to FIG. 2.

The horizontal transfer scanning circuit 103 includes a shift register, an address decoder, and the like, and sequentially selects unit circuits of the ADCs 102-1 to 102-N corresponding to the pixel columns. Due to the selection and scanning of the horizontal transfer scanning circuit 103, the pixel signals subjected to the signal processing in the ADC 102 are sequentially output to the arithmetic control unit 106.

Figure 2:
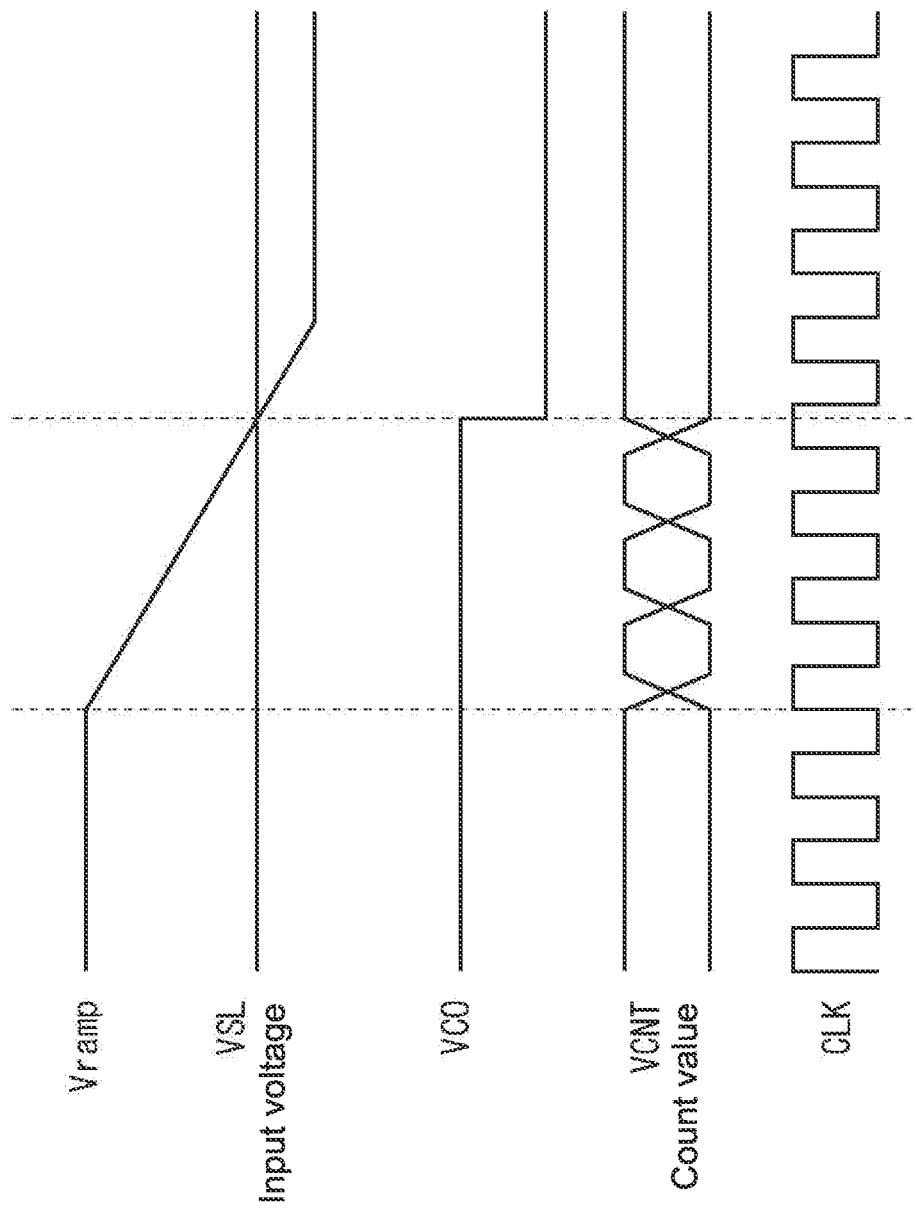
FIG. 2 is a timing chart for describing an operation of an analog-to-digital converter (ADC)

Now, referring to FIG. 2, the processing in the ADC 102 will be described. The ADC 102 includes a comparator 141 and a counter 142. FIG. 2 is a timing chart of the ADC 102. In the ADC 102 shown in FIG. 1, sweeping of a reference voltage Vramp from the DAC 104 starts at the comparator 141, and, at the same time, a count operation of the counter 142 starts. When the reference voltage Vramp drops below an input voltage VSL, an output signal VCO of the comparator 141 is reversed from a high level to a low level. This falling edge stops the count operation of the counter 142. A count value VCNT is in a one-to-one relation with a voltage width of the reference voltage Vramp swept. The count value VCNT is a result of analog-to-digital (AD) converting an input voltage.

Data items from the ADC 102 are provided to the arithmetic control unit 106 by the processing of the horizontal transfer scanning circuit 103. The arithmetic control unit 106 has a configuration including an image signal processing unit 161, a data selector 162, an illuminance calculation unit 163, a determination unit 164, and an exposure control unit 165. The image signal processing unit 161 processes a data item from the horizontal transfer scanning circuit 103, generates an image signal, and outputs the image signal to the output control circuit 108. The data item from the horizontal transfer scanning circuit 103 is provided also to the data selector 162 and the determination unit 164.

The data selector 162 selects a data item corresponding to a determination result of the determination unit 164 and outputs the data item to the illuminance calculation unit 163. The determination unit 164 determines which of a long-term stored data item and a short-term stored data item is to be selected, and outputs a determination result to the data selector 162 and the exposure control unit 165. The long-term stored data item is a first digital electrical signal output corresponding to a first exposure time. The short-term stored data item is a second digital electrical signal output corresponding to a second exposure time. The first exposure time is set to be longer than the second exposure time.

The long-term stored data item is a data item obtained when long-term exposure is performed. The short-term stored data item is a data item obtained when short-term exposure is performed. The first exposure time and the second exposure time may be fixed or may be varied depending on a predetermined condition.

The determination unit 164 generates, from the supplied long-term stored data item and short-term stored data item, a data item by a predetermined operation, and determines, based on the data item, whether or not a saturation state occurs. The determination unit 164 outputs an exposure time during which it is determined that the saturation state does not occur, as a determination result. A data item corresponding to the exposure time during which it is determined that the saturation state does not occur is selected by the data selector 162 and output to the illuminance calculation unit 163. The illuminance calculation unit 163 calculates an illuminance using the long-term stored data item or short-term stored data item selected by the data selector 162, and outputs the illuminance to the output control circuit 107.

The illuminance is calculated based on Expression (1) below.

Illuminance=(long-term stored data item or short-term stored data item[LSB]×1LSB voltage[mV/LSB])/(sensitivity[mv/(lux-s)]×long storage time or short storage time[s]) (1)

In Expression (1), a selected data item is used in the "long-term stored data item or short-term stored data item" and a storage time (exposure time) corresponding to the selected data item is used in the "long storage time or short storage time."

The determination result of the determination unit 164 is supplied also to the exposure control unit 165 and used for exposure control, for example, control to perform short-term exposure or long-term exposure. The exposure control unit 165 controls the vertical scanning circuit 105 and controls a read-out timing in a vertical direction.

Figure 3:
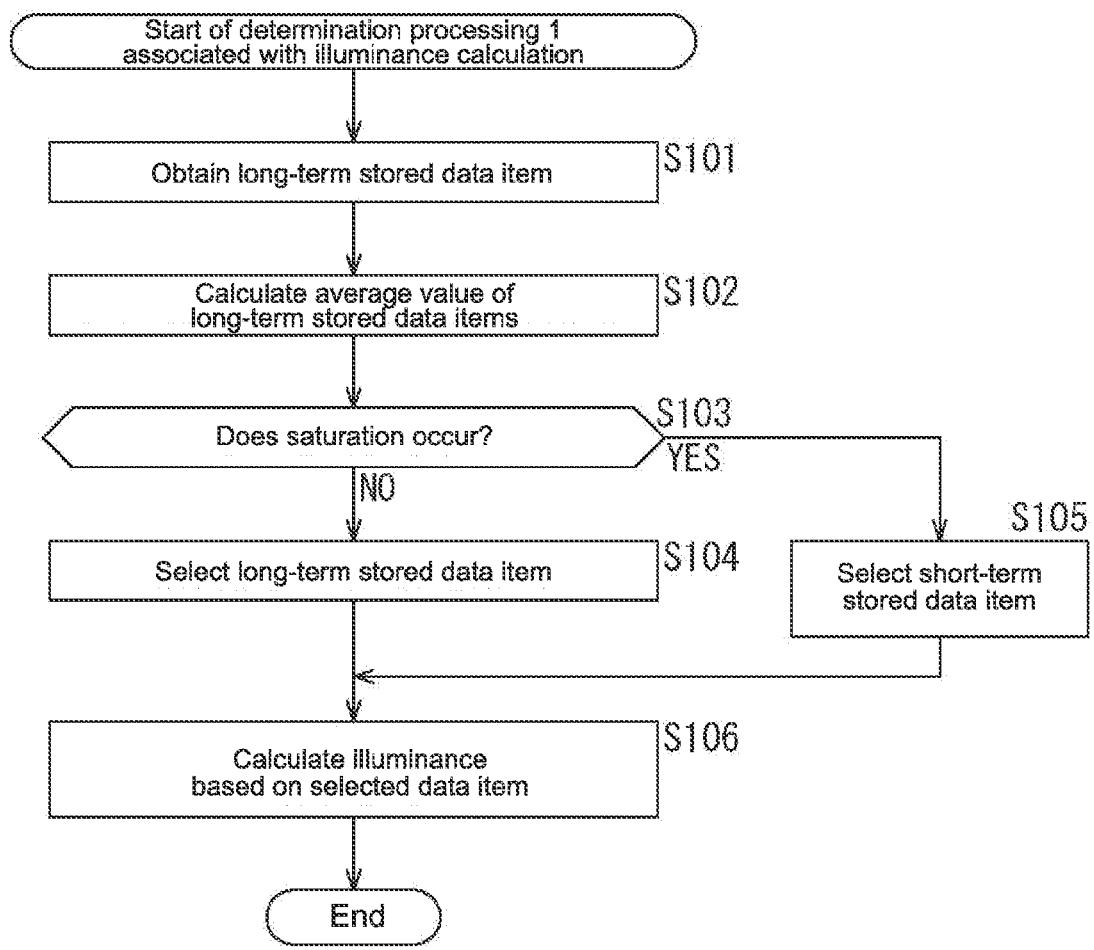
FIG. 3 is a flowchart for describing determination processing associated with illuminance calculation.

As the first embodiment, an embodiment in which a determination of the determination unit 164 is performed by calculating an average value of the supplied long-term stored data item or short-term stored data item will be exemplified and described. FIG. 3 is a flowchart for describing processing associated with the calculation of the illuminance.

In Step S101, the determination unit 164 obtains the long-term stored data item. The long-term stored data item is a data item relating to the amount of charge accumulated in each unit pixel 121 during exposure for the first exposure time. Data items relating to the amount of charge may be obtained from all the unit pixels 121 constituting the pixel unit 101. However, data items relating to the amount of charge may be obtained in a thinning-out state.

For example, not all the pixel row but the thinned-out pixel rows may be vertically scanned and outputs depending on the amount of incident light may be transmitted from the scanned pixel rows to the vertical signal line 122 of each column. The thinned-out pixel rows are vertically scanned, and hence power consumption can be reduced and the capacity of a buffer for temporarily storing data items in order to determine an average value can be reduced. In addition, the amount of data item is reduced, and hence the processing capacity can be saved.

In the case where the thinned-out data items described above are obtained, when a data item for calculating an illuminance is obtained, the exposure control unit 165 controls the vertical scanning circuit 105 based on an instruction from the determination unit 164 such that such read-out is performed. The determination unit 164 issues an instruction to the exposure control unit 165 during the illuminance calculation. This enables the exposure control unit 165 to switch between controlling read-out during the illuminance calculation and controlling read-out for obtaining an image signal.

In Step S102, the determination unit 164 calculates an average value from long-term stored data items. Whether or not the average value calculated in Step S102 exceeds a value upon saturation (threshold value) is determined, to thereby determine whether or not the saturation state occurs during the long-term exposure.

In Step S103, the determination unit 164 determines whether or not saturation occurs. In Step S103, if it is determined that the saturation does not occur, that is, if it is determined that the saturation does not occur due to the long-term exposure, the processing proceeds to Step S104. In Step S104, the long-term stored data item is selected.

The determination unit 164 notifies the data selector 162 of the selection of the long-term stored data item. Then, the data selector 162 selects the long-term stored data item and outputs the selected long-term stored data item to the illuminance calculation unit 163.

The illuminance calculation unit 163 obtains, in Step S106, the long-term stored data item selected by the data selector 162 and output, and calculates, based on Expression (1) above, an illuminance. The illuminance is output to the output control circuit 107.

Otherwise, in Step S103, it is determined that the saturation occurs, that is, if it is determined that the saturation occurs due to the long-term exposure, the processing proceeds to Step S105. In Step S105, the short-term stored data item is selected.

The determination unit 164 notifies the data selector 162 of the selection of the short-term stored data item. The data selector 162 selects the short-term stored data item and outputs the short-term stored data item to the illuminance calculation unit 163. If the short-term stored data item is configured to be supplied after the long-term stored data item is supplied to the data selector 162, the short-term stored data item may be obtained while a determination is made by the determination unit 164 based on the long-term stored data item, and the short-term stored data item may be selected.

The illuminance calculation unit 163 obtains, in Step S106, the short-term stored data item selected in the data selector 162 and output, and calculates an illuminance based on Expression (1) above. The illuminance is output to the output control circuit 107.

Although the average value is calculated from the long-term stored data items and whether or not saturation occurs due to the long-term exposure is determined in the above description, an average value may be calculated from short-term stored data items and a determination may be made. In the case where an average value is calculated from short-term stored data items and a determination is made, whether or not the calculated average value is smaller than a predetermined threshold value is determined.

If the average value is smaller than the predetermined threshold value, it is determined that the exposure time is short, and, since the output is insufficient, the long-term stored data item obtained during the long-term exposure is selected. Otherwise, if the average value is larger than the predetermined threshold value, it is determined that the exposure time is sufficient and the short-term stored data item obtained during the short-term exposure is selected. In this manner, even in the case where the average value of the short-term stored data items is used, whether or not the exposure time is appropriate can be performed and a determination as to the selection of the long-term stored data item or the short-term stored data item can be made.

Further, in the case where an average value is calculated from short-term stored data items and a determination is made, by supplying a long-term stored data item after a short-term stored data item is supplied to the data selector 162, the data selector 162 can obtain the long-term stored data item after the determination unit 164 makes a determination based on the short-term stored data item as in the above-mentioned case.

Although the average value is calculated from the long-term stored data items or the short-term stored data items and the determination is made in the above description, an average value of long-term stored data items and an average value of short-term stored data items may be calculated and determinations may be made.

For example, such a configuration can also address a situation where it is determined that the saturation occurs due to the long-term exposure because the average value calculated from the long-term stored data items is larger than a predetermined value and it is determined that the exposure time of the short-term exposure is insufficient because the average value calculated from the short-term stored data items is smaller than the predetermined value. If such a situation occurs, a control to use an exposure time between the long-term exposure and the short-term exposure (first exposure time and second exposure time) can be performed. Thus, a finer illuminance control can be performed.

In this manner, the average value is calculated from the long-term stored data items or the short-term stored data items and whether or not saturation occurs is determined, and hence an appropriate illuminance can be calculated and a control based on the appropriate illuminance can be performed.

Although two data items of the long-term stored data item and the short-term stored data item are used in the above description, a plurality of data items may be used. In this case, the exposure control unit 165 is configured to be capable of controlling a plurality of exposure times and the determination unit 164 is configured to obtain data items when a control is performed during one exposure time of the plurality of exposure times.

The determination unit 164 calculates an average value from the obtained data items and determines whether or not saturation occurs due to the exposure time during which the data item is obtained. Depending on a determination result, for example, if it is determined that the saturation occurs, such that an illuminance is calculated using a different data item, the data selector 162 is configured to select the data item and output the data item to the illuminance calculation unit 163.

Further, the exposure control unit 165 is configured to control exposure times such that the data selector 162 can select a different data item and the illuminance calculation unit 163 can calculate an illuminance using the different data item.

In this manner, the exposure control unit 165 may be capable of controlling a plurality of exposure times and the determination unit 164 may determine whether or not saturation occurs using at least one data item of a plurality of data items obtained during the plurality of exposure times. Further, if it is determined that the saturation occurs, the data selector 162 may be configured to select another data item assumed to have been obtained without saturation (data item different from data item used in determination), and the illuminance calculation unit 163 may be configured to calculate an illuminance based on the selected data item.

Figure 4A:
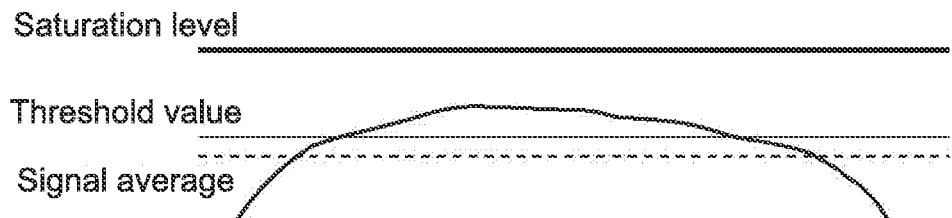
FIGS. 4A to 4C are diagrams for describing saturation.
Figure 4B:
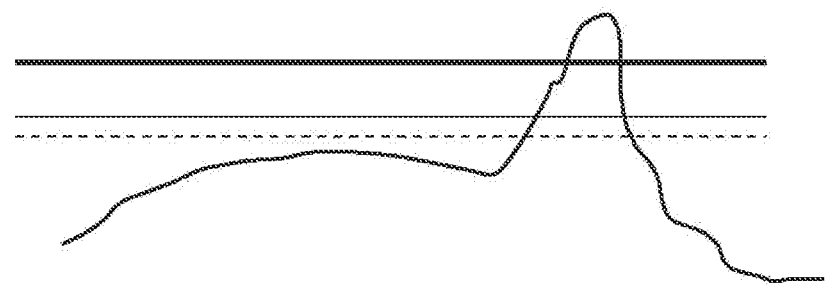
Figure 4C:
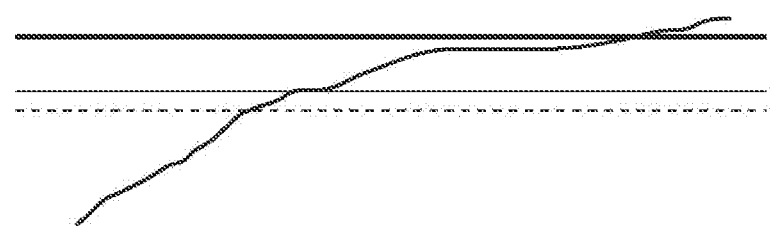

In the case where the above-mentioned average value is calculated and whether or not saturation occurs is determined based on the average value, even if pixels exceeding a saturation level under a particular condition are present, there is a possibility that the long-term stored data item is selected and a determination is made. Referring to FIGS. 4A to 4C, a case where pixels exceeding a saturation level under a particular condition will be described.

Graphs shown in FIGS. 4A to 4C are graphs relating to an incident light distribution. In FIGS. 4A to 4C, thick straight solid lines indicate a saturation level and thin straight solid lines indicate a threshold value, straight dotted lines indicate an average value, and a curve solid lines indicate a distribution of long-term stored data items being data items from which an average value is calculated.

FIGS. 4A to 4C show a case where the average value is smaller than the threshold value, the long-term stored data item is selected as the data item for the illuminance calculation. In such a case and in the case where all the long-term stored data items are below the saturation level as shown in FIG. 4A, selecting the long-term stored data item and calculating an illuminance based on the long-term stored data item are correct processing.

As shown in FIG. 4B, even in the case where some of long-term stored data items exceed the saturation level, if others are below the saturation level, an average value of the long-term stored data items is equal to or smaller than the threshold value in some cases. For example, in the case of a local-light-source image in which a light source is included in part of the image and the light source is bright but the surroundings of the light source are dark, there is a possibility that the state as shown in FIG. 4B is obtained.

Further, for example, in the case of a gradation image the brightness of which gradually increases, as shown in FIG. 4C, there is a possibility that some of long-term stored data items exceed the saturation level.

Even in the cases of the states shown in FIGS. 4B and 4C, the average value is equal to or smaller than the threshold value, and hence the long-term stored data item is selected and an illuminance is calculated based on the long-term stored data item. In such cases, the accuracy of the illuminance calculation lowers. In order to calculate an illuminance with high accuracy when the local-light-source image and the gradation image are captured, an embodiment in which a determination is made using a data item other than an average value will be described below.

Second Embodiment

Figure 5:
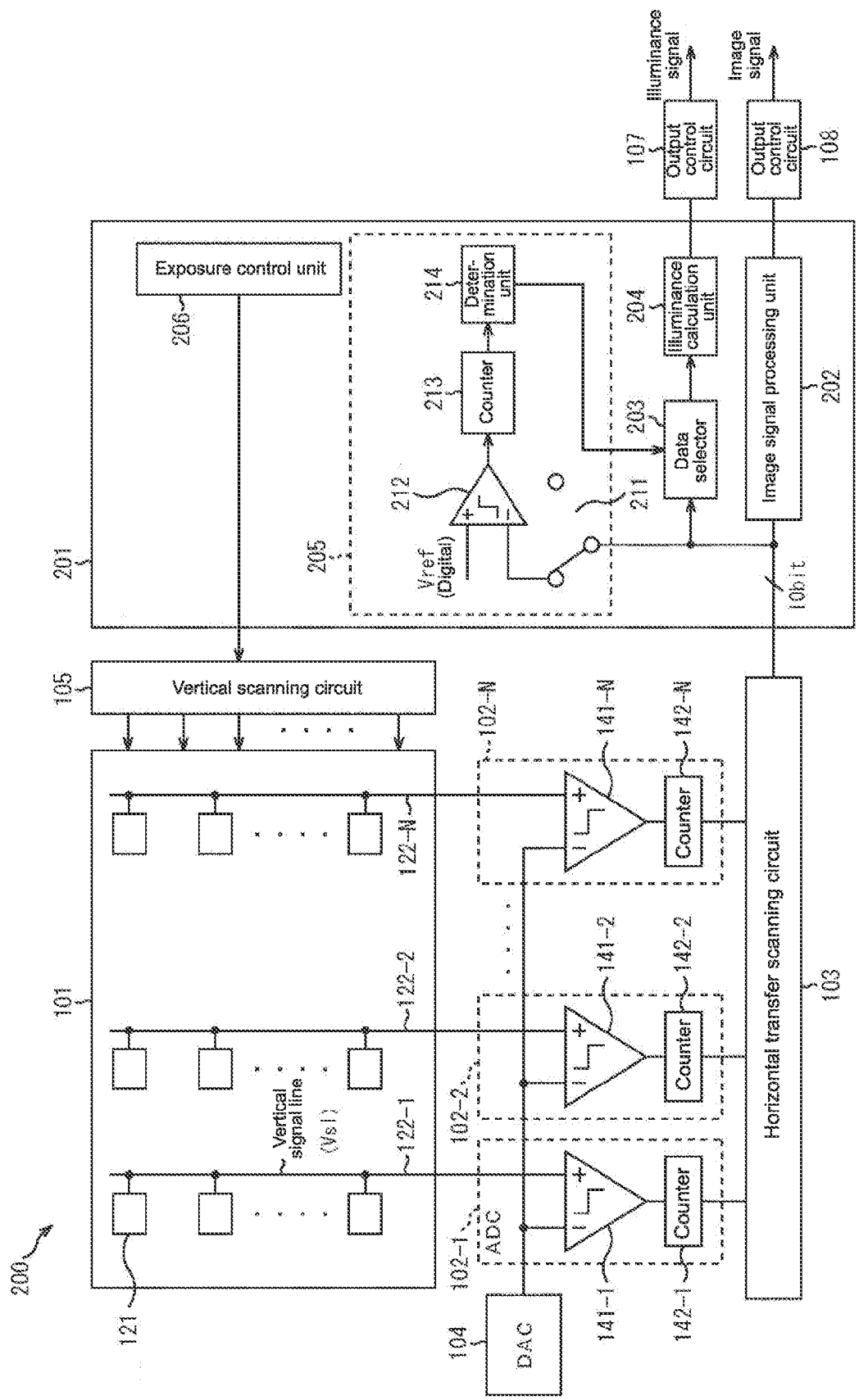
FIG. 5 is a diagram showing a configuration of a solid-state imaging device according to a second embodiment.

FIG. 5 is a diagram showing a configuration of a solid-state imaging device 200 according to a second embodiment. The solid-state imaging device 200 shown in FIG. 5 includes a pixel unit 101, an ADC 102, a horizontal transfer scanning circuit 103, a DAC 104, a vertical scanning circuit 105, an output control circuit 107, an output control circuit 108, and an arithmetic control unit 201.

Comparing the solid-state imaging device 200 shown in FIG. 5 with the solid-state imaging device 100 shown in FIG. 1, a configuration of the arithmetic control unit 201 is different from the arithmetic control unit 106 shown in FIG. 1 and other parts are the same. The same parts as those of the solid-state imaging device 100 shown in FIG. 1 will be denoted by the same reference symbols and descriptions thereof will be appropriately omitted.

The arithmetic control unit 201 includes an image signal processing unit 202, a data selector 203, an illuminance calculation unit 204, and a saturation determination unit 205. The saturation determination unit 205 includes a switch 211, a digital comparator 212, a counter 213, and a determination unit 214.

A long-term stored data item or a short-term stored data item is supplied from the horizontal transfer scanning circuit 103 to the data selector 203 of the arithmetic control unit 201 and to the digital comparator 212 via the switch 211. The digital comparator 212 is supplied with a reference voltage Vref. The reference voltage Vref is compared with the long-term stored data item or the short-term stored data item. In the following description, it is assumed that the long-term stored data item is compared.

The counter 213 counts, out of data items output from the digital comparator 212, the number of data items in which it is determined that the long-term stored data item is larger than the reference voltage Vref. The determination unit 214 determines whether or not the value counted by the counter 213 is equal to or larger than a threshold value. For example, the threshold value in the determination unit 214 is set to be 5% of the number of pixels outputting the long-term stored data item.

The long-term stored data item can be a data item relating to the amount of charge accumulated during exposure for the first exposure time in each unit pixel 121. Alternatively, not all pixel rows but thinned-out pixel rows may be vertically scanned and outputs depending on the amount of incident light may be transmitted from the scanned pixel rows to the vertical signal line 122 of each column.

In the case where the thinned-out data items are obtained, when a data item for calculating an illuminance is obtained, an exposure control unit 206 controls the vertical scanning circuit 105 based on an instruction from the determination unit 214 such that such read-out is performed. The determination unit 214 issues an instruction to the exposure control unit 206 during the illuminance calculation. This enables the exposure control unit 206 to switch between controlling read-out during the illuminance calculation and controlling read-out for obtaining an image signal.

Although shown in FIG. 5, signal lines for issuing an instruction of such switching are provided from the determination unit 214 to the exposure control unit 206. Alternatively, a signal for such switching may be supplied from a controller (not shown) to the exposure control unit 206.

Figure 6:
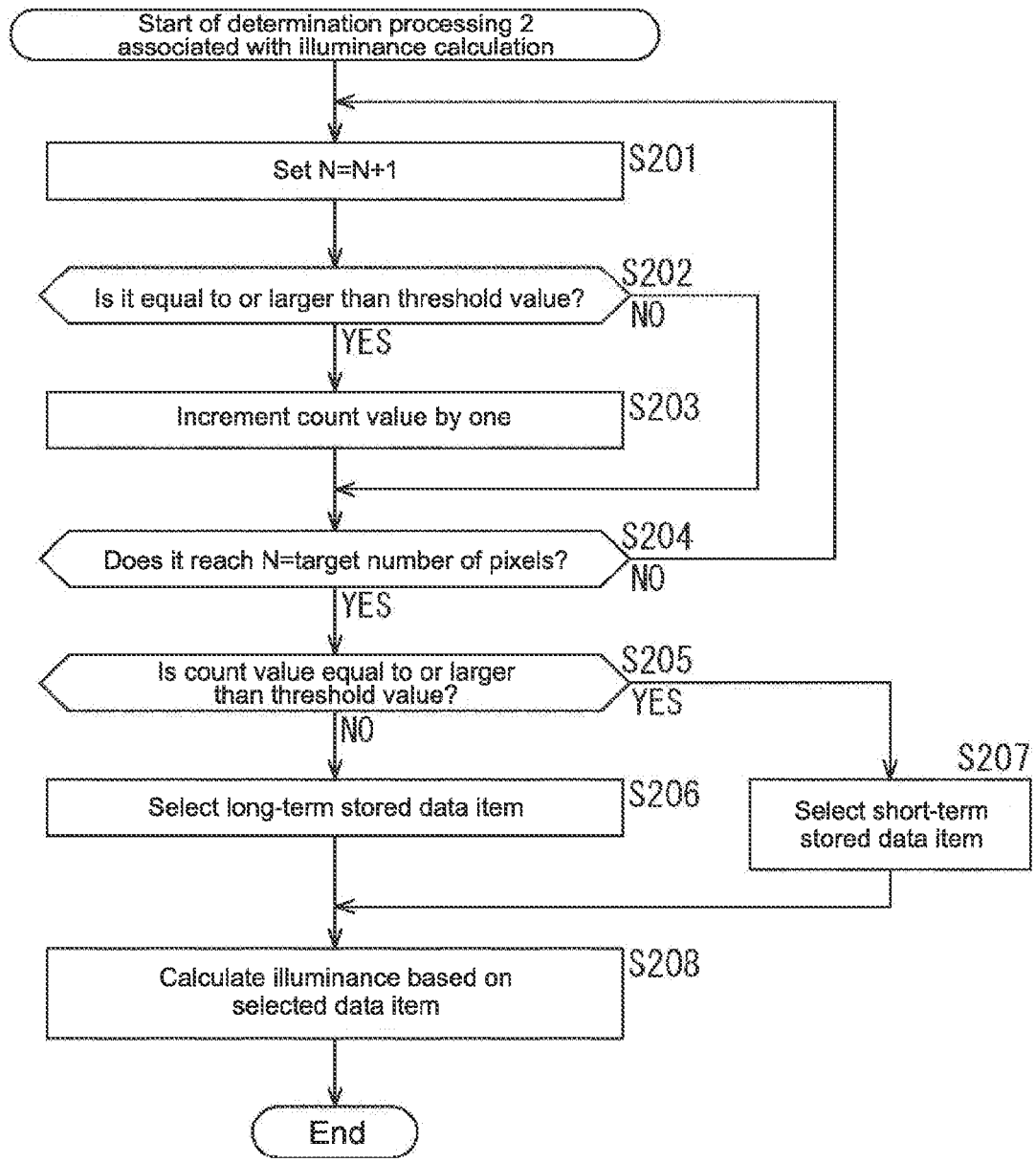
FIG. 6 is a flowchart for describing determination processing associated with illuminance calculation in the second embodiment.

Referring to a flowchart of FIG. 6, processing associated with calculation of an illuminance in the solid-state imaging device 200 will be described. In Step S201, N=N+1 is set. An initial value of N is 0, which is a value for identifying a pixel to be processed. For example, numbers are assigned to pixels from an upper left pixel to a lower right pixel of the pixel unit 101. When the value of N becomes one of the numbers, a data item of the pixel assigned with the number is set as a processing target.

In Step S202, whether or not an Nth long-term stored data item is equal to or larger than the threshold value is determined. The digital comparator 212 outputs a plus value if the input Nth long-term stored data item is equal to or larger than the reference voltage Vref (threshold value), and outputs a minus value if the input Nth long-term stored data item is smaller than the threshold value. The counter 213 determines, if the digital comparator 212 outputs the plus value, that the long-term stored data item as the processing target is equal to or larger than the threshold value, and determines, if the digital comparator 212 outputs the minus value, that the long-term stored data item as the processing target is smaller than the threshold value.

The reference voltage Vref is set to be a value smaller than the saturation level value and highly likely to cause saturation beyond the value, and is used as the threshold value for determining whether or not saturation occurs. The threshold value used in the digital comparator 212 is set as, for example, a value of 90% of the saturation level. The threshold value may be fixed or may be varied. Note that 90% is an example and should not be construed as limiting.

If it is determined in Step S202 that the long-term stored data item as the processing target is equal to or larger than the threshold value, the processing proceeds to Step S203. In Step S203, the counter 213 updates the value to a value obtained by incrementing a counter value by one.

After the processing of Step S203 or in Step S202, if it is determined that the long-term stored data item as the processing target is not equal to or larger than the threshold value, the processing proceeds to Step S204.

In Step S204, whether or not N reaches the number of pixels as the processing target is determined. In Step S204, if it is determined that the N=target number of pixels is not established, the processing returns to Step S201 and the subsequent processing is performed again. Specifically, a subsequent pixel is set as the processing target and whether or not the subsequent pixel is equal to or larger than the threshold value is determined.

Otherwise, in Step S204, it is determined that N=target number of pixels is established, the processing proceeds to Step S205. In Step S205, the determination unit 214 determines whether or not the count value counted by the counter 213 is equal to or larger than the threshold value. The threshold value in the determination unit 214 is set to be, for example, the number of pixels as the processing target, in other words, 5% of the target number of pixels when it is determined that N=target number of pixels is established in the processing in Step S204.

Note that 5% is an example, should not be construed as limiting, and is set considering properties or the like of the unit pixels 121. Alternatively, the threshold value in the determination unit 214 may be fixed or varied.

In Step S205, if it is determined that the count value is not equal to or larger than the threshold value, the processing proceeds to Step S206. In Step S206, the long-term stored data item is selected. In this case, it is determined that the saturation does not occur due to the long-term exposure, and hence the processing proceeds to Step S206 and the long-term stored data item is selected.

The determination unit 214 notifies the data selector 203 of the selection of the long-term stored data item. The data selector 203 selects the long-term stored data item and outputs the long-term stored data item to the illuminance calculation unit 204. In Step S208, the illuminance calculation unit 204 obtains a long-term stored data item selected by the data selector 203 and output, and calculates an illuminance based on Expression (1) above and outputs the illuminance to the output control circuit 107.

Otherwise, in Step S205, it is determined that the count value is equal to or larger than the threshold value, that is, if it is determined that the saturation occurs due to the long-term exposure, the processing proceeds to Step S207. In Step S207, the short-term stored data item is selected.

The determination unit 214 notifies the data selector 203 of the selection of the short-term stored data item. The data selector 203 selects the short-term stored data item and outputs the short-term stored data item to the illuminance calculation unit 204. In Step S208, the illuminance calculation unit 204 obtains the short-term stored data item selected by the data selector 203 and output, and calculates an illuminance based on Expression (1) above and outputs the illuminance to the output control circuit 107.

Note that, in the above description, the long-term stored data item is compared with the threshold value (hereinafter, referred to as first threshold value), the number of data items each having a value equal to or larger than the first threshold value is counted, whether or not the count value is equal to or larger than the threshold value (hereinafter, referred to as second threshold value) is determined, and thus whether or not saturation occurs due to the long-term exposure is determined.

However, a determination may be made based on not the long-term stored data item but the short-term stored data item. In the case where the short-term stored data item is compared with a third threshold value, whether or not the short-term stored data item is equal to or smaller than the third threshold value.

If it is determined that the short-term stored data item is equal to or smaller than the third threshold value and a counted count value is equal to or lager than a fourth threshold value, it is determined that the exposure time is short and, since the output is insufficient, the long-term stored data item obtained during the long-term exposure is selected.

Otherwise, if the count value is smaller than the fourth threshold value, it is determined that the exposure time is sufficient and the short-term stored data item obtained during the short-term exposure is selected. In this manner, even in the case where the count value obtained from the short-term stored data item is used, whether or not the exposure time is appropriate can be determined and a determination associated with the selection of the long-term stored data item or the short-term stored data item can be made.

Now, referring to FIG. 7, the processing associated with the calculation of the illuminance in the solid-state imaging device 200 will be described again. A point of time T1 to a point of time T2 correspond to the first exposure time (long storage time). A data item when exposure is performed for the first exposure time is obtained by the saturation determination unit 205 (FIG. 5). In the saturation determination unit 205, the processing in Steps S201 to S204 is repeated, and hence the number of values exceeding the threshold value in the digital comparator 212 is counted.

At the point of time T2, a determination is made by the determination unit 214. This processing corresponds to the processing in Step S205. As the result of the determination made at the point of time T2, which of the long-term stored data item and the short-term stored data item is to be selected is determined. A point of time T3 to a point of time T4 correspond to the second exposure time (short storage time) and a data item when exposure is performed for the second exposure time is obtained if necessary.

If the determination unit 214 determines that the long-term stored data item is to be selected, the data selector 203 selects the long-term stored data item (corresponding to processing in Step S206). The long-term stored data item selected by the data selector 203 at this time may be a long-term stored data item obtained during the first exposure time from the point of time T1 to the point of time T2 or may be a long-term stored data item obtained during the first exposure time from a point of time T5 to a point of time T6.

Otherwise, if the determination unit 214 determines that the short-term stored data item is to be selected, the data selector 203 selects the short-term stored data item (corresponding to processing in Step S207). The short-term stored data item selected by the data selector 203 at this time is a short-term stored data item obtained during the second exposure time from the point of time T3 to the point of time T4.

The illuminance calculation unit 204 calculates an illuminance based on the long-term stored data item or the short-term stored data item and outputs the illuminance (corresponding to processing in Step S208).

The illuminance is output at, for example, the point of time T6. At the point of time T6, both of the long-term stored data item and the short-term stored data item are already obtained, and hence the illuminance can be calculated even if either one of the long-term stored data item and the short-term stored data item is selected.

Note that, if the long-term stored data item is selected, the obtention of the short-term stored data item that is performed between the point of time T3 and the point of time T4 may be omitted. If the long-term stored data item is selected and the long-term stored data item obtained between the point of time T1 and the point of time T2 is used for the illuminance calculation, the illuminance may be calculated and output between the point of time T2 and the point of time T3.

Figure 7:
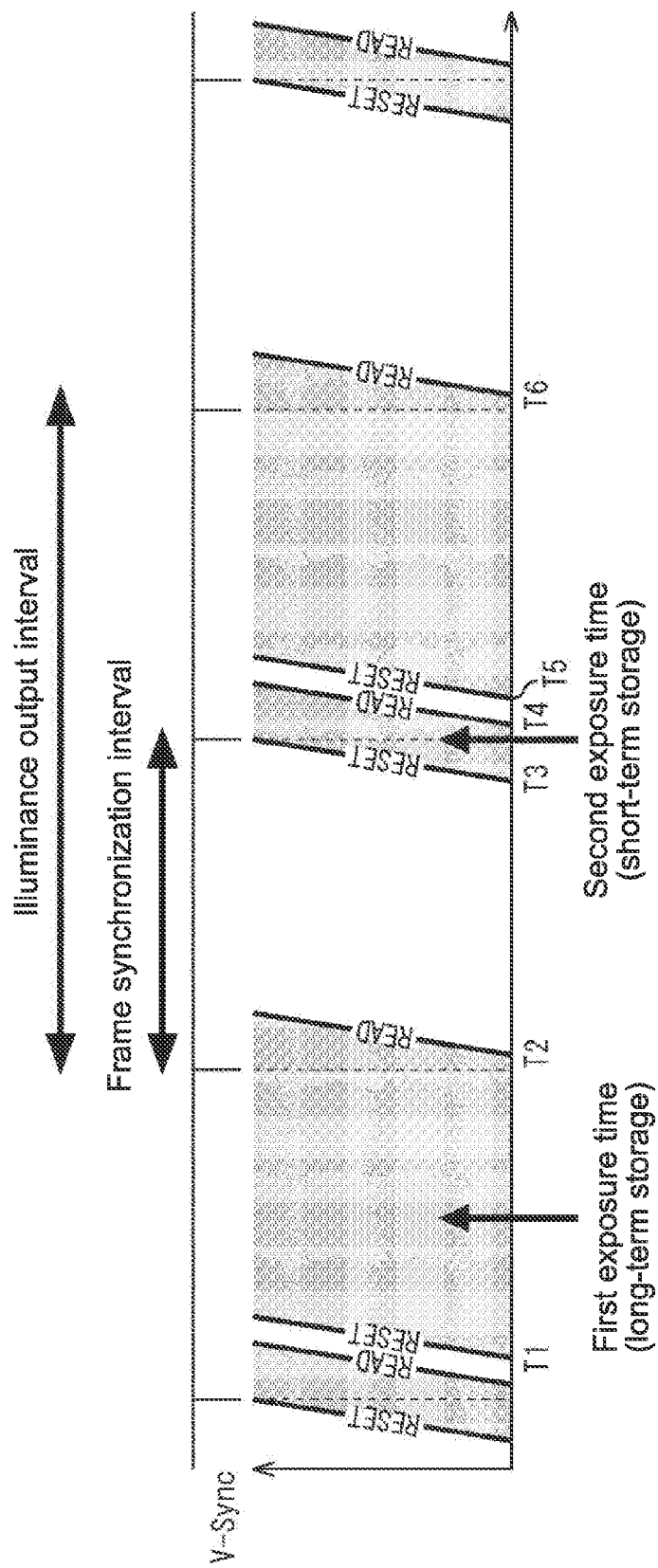
FIG. 7 is a diagram for describing determination processing associated with the illuminance calculation.

In the example shown in FIG. 7, the long-term stored data item obtained during the first exposure time from the point of time T1 to the point of time T2 and the short-term stored data item obtained during the second exposure time from the point of time T3 to the point of time T4 are paired. However, for example, the short-term stored data item obtained during the second exposure time from the point of time T3 to the point of time T4 and the long-term stored data item obtained during the first exposure time from the point of time T5 to the point of time T6 may be paired.

In this manner, the long-term stored data item exceeding the first threshold value is counted and whether or not the counted count value exceeds the second threshold value is determined, to thereby determine whether or not the saturation state occurs, and thus the illuminance can be calculated with higher accuracy. Now, referring to FIGS. 8A to 8C, a description will be added to the capability of calculating an illuminance without using a data item obtained when the saturation occurs.

Figure 8A:
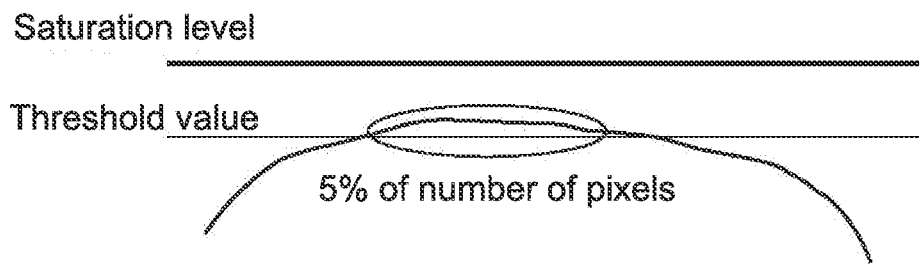
FIGS. 8A to 8C are diagrams for describing saturation.
Figure 8B:
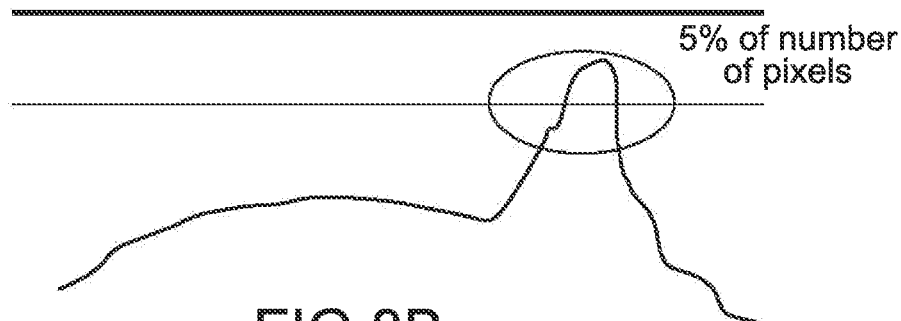
Figure 8C:
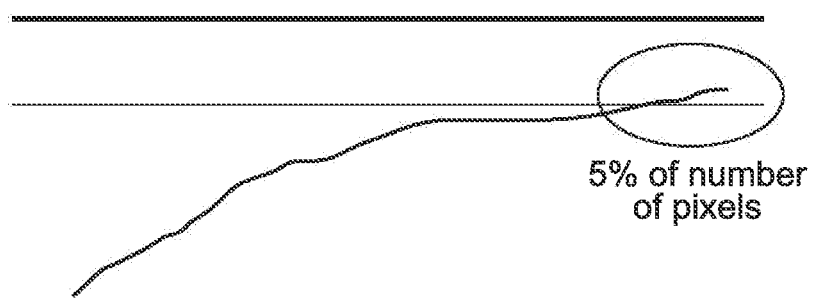

FIGS. 8A to 8C are graphs relating to an incident light distribution as in the graphs shown in FIGS. 4A to 4C. As in FIGS. 4A to 4C, in FIGS. 8A to 8C, thick straight solid lines indicate a saturation level, thin straight solid lines indicate a first threshold value, and a curve solid lines indicate a distribution of long-term stored data items compared with the first threshold value.

In FIGS. 8A to 8C, in portions in which ellipses are drawn, the long-term stored data items exceed the first threshold value. If the number of data items exceeding the first threshold value is not larger than a second threshold value in the determination unit 214, the long-term stored data item is selected. If the number of data items exceeding the first threshold value is larger than the second threshold value, the short-term stored data item is selected. The second threshold value is set to be, for example, 5% of the number of long-term stored data items.

As described above with reference to FIG. 4B, in the case where the local-light-source image is captured, there is a possibility that pixels in part of the image are in the saturation state. Even in the case where such a local light source is present, as shown in FIG. 8B, if the number of data items exceeding the first threshold value is equal to or larger than the second threshold value, it is determined that the long-term stored data item is obtained when the saturation occurs and the long-term stored data item can be prevented from being used for the illuminance calculation. Thus, it is possible to prevent the calculation of an illuminance using the data item exceeding the saturation level.

Further, as described above with reference to FIG. 4C, also in the case where a gradation image the brightness of which gradually increases, there is a possibility that pixels in part of the image are in the saturation state. Even in the case where such gradation is present, as shown in FIG. 8C, if the number of data items exceeding the first threshold value is equal to or larger than the second threshold value, it is determined that the long-term stored data item is obtained when the saturation occurs and the long-term stored data item can be prevented from being used for the illuminance calculation. Thus, it is possible to prevent the calculation of an illuminance using the data item exceeding the saturation level.

In this manner, the long-term stored data item exceeding the first threshold value is counted and whether or not the counted count value is larger than the second threshold value is determined to determine whether or not the saturation state occurs, and thus the illuminance can be calculated with higher accuracy. Further, a configuration for counting the long-term stored data items exceeding the first threshold value can be simplified and low power consumption can be realized.

Although the two data items of the long-term stored data item and the short-term stored data item are used in the above description, a plurality of data items may be used. In this case, the exposure control unit 206 is configured to be capable of controlling a plurality of exposure times and the digital comparator 212 is configured to obtain data items when a control is performed during one exposure time of the plurality of exposure times.

A comparison result from the digital comparator 212 is supplied to the counter 213 and the number of data items satisfying a predetermined condition, for example, a condition that the number of data items is equal to or larger than a threshold value as in the above-mentioned case is counted. Based on the count value, the determination unit 214 determines whether or not saturation occurs due to the exposure time during which the data item is obtained. Depending on a determination result, for example, when it is determined that the saturation occurs, such that an illuminance is calculated by using a different data item, the data selector 203 is configured to select the data item and output the data item to the illuminance calculation unit 204.

In this manner, the exposure control unit 206 may be configured to be capable of controlling the plurality of exposure times and the determination unit 214 may be configured to determine whether or not saturation occurs using at least one data item of the plurality of data items obtained from the plurality of exposure times. Further, if it is determined that the saturation occurs, the data selector 203 may be configured to select another data item assumed to have been obtained without saturation (data item different from data item used in determination), and the illuminance calculation unit 204 may be configured to calculate an illuminance based on the selected data item.

Third Embodiment

Figure 9:
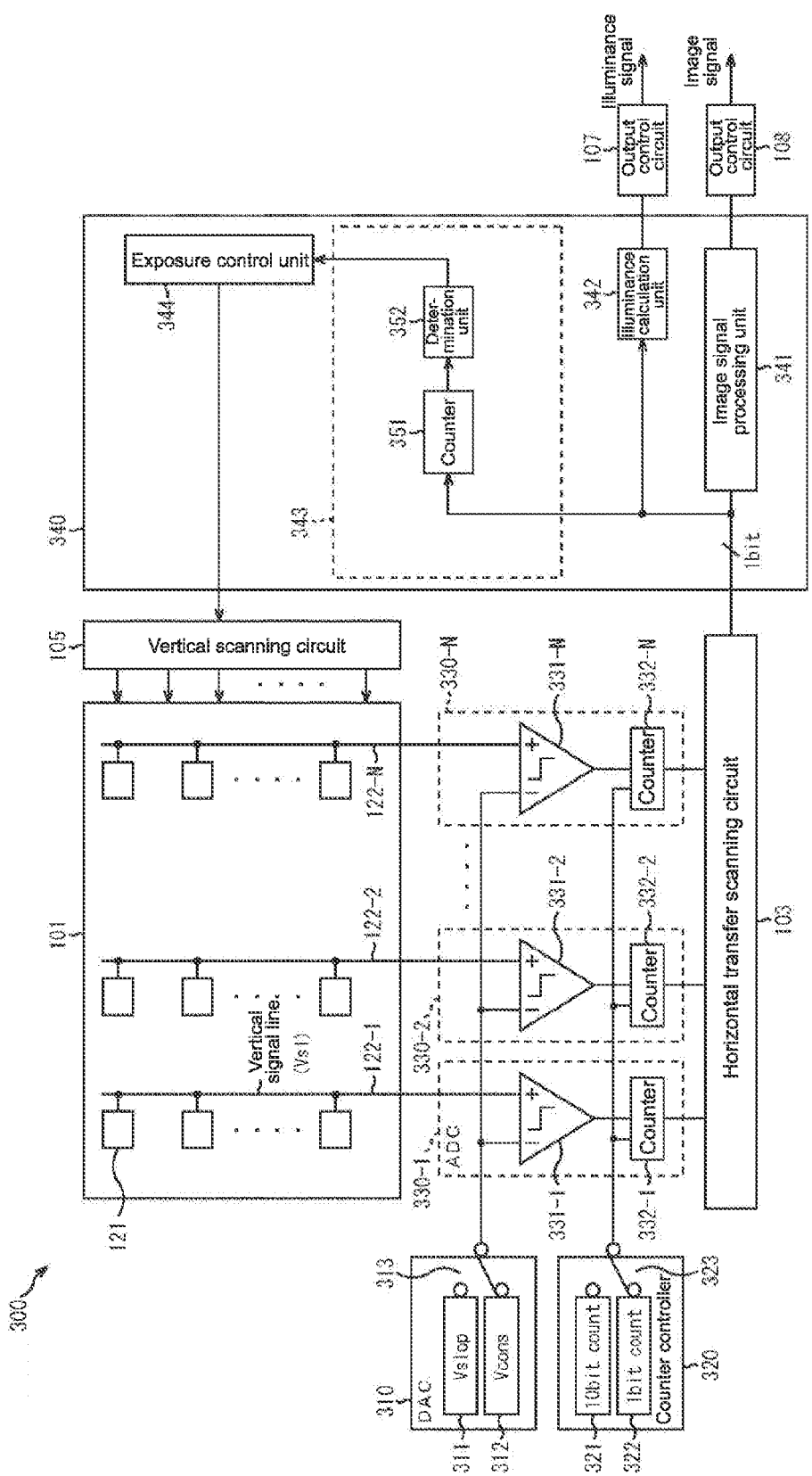
FIG. 9 is a diagram showing a configuration of a solid-state imaging device according to a third embodiment.

FIG. 9 is a diagram showing a configuration of a solid-state imaging device 300 according to a third embodiment. The solid-state imaging device 300 shown in FIG. 5 includes a pixel unit 101, a horizontal transfer scanning circuit 103, a vertical scanning circuit 105, an output control circuit 107, an output control circuit 108, a DAC 310, a counter controller 320, an ADC 330, and an arithmetic control unit 340.

Comparing the solid-state imaging device 300 shown in FIG. 9 with the solid-state imaging device 100 shown in FIG. 1, configurations of the pixel unit 101, the horizontal transfer scanning circuit 103, the vertical scanning circuit 105, the output control circuit 107, and the output control circuit 108 of the solid-state imaging device 300 are the same as those of the solid-state imaging device 100, and hence the same portion as those of the solid-state imaging device 100 will be denoted by the same reference symbols and descriptions thereof will be appropriately omitted.

The DAC 310 includes a Vslop 311, a Vcons 312, and a switch 313. The counter controller 320 includes a 10-bit count 321, a 1-bit count 322, and a switch 323. The ADC 330 includes a comparator 331 and a counter 332.

Figure 10:
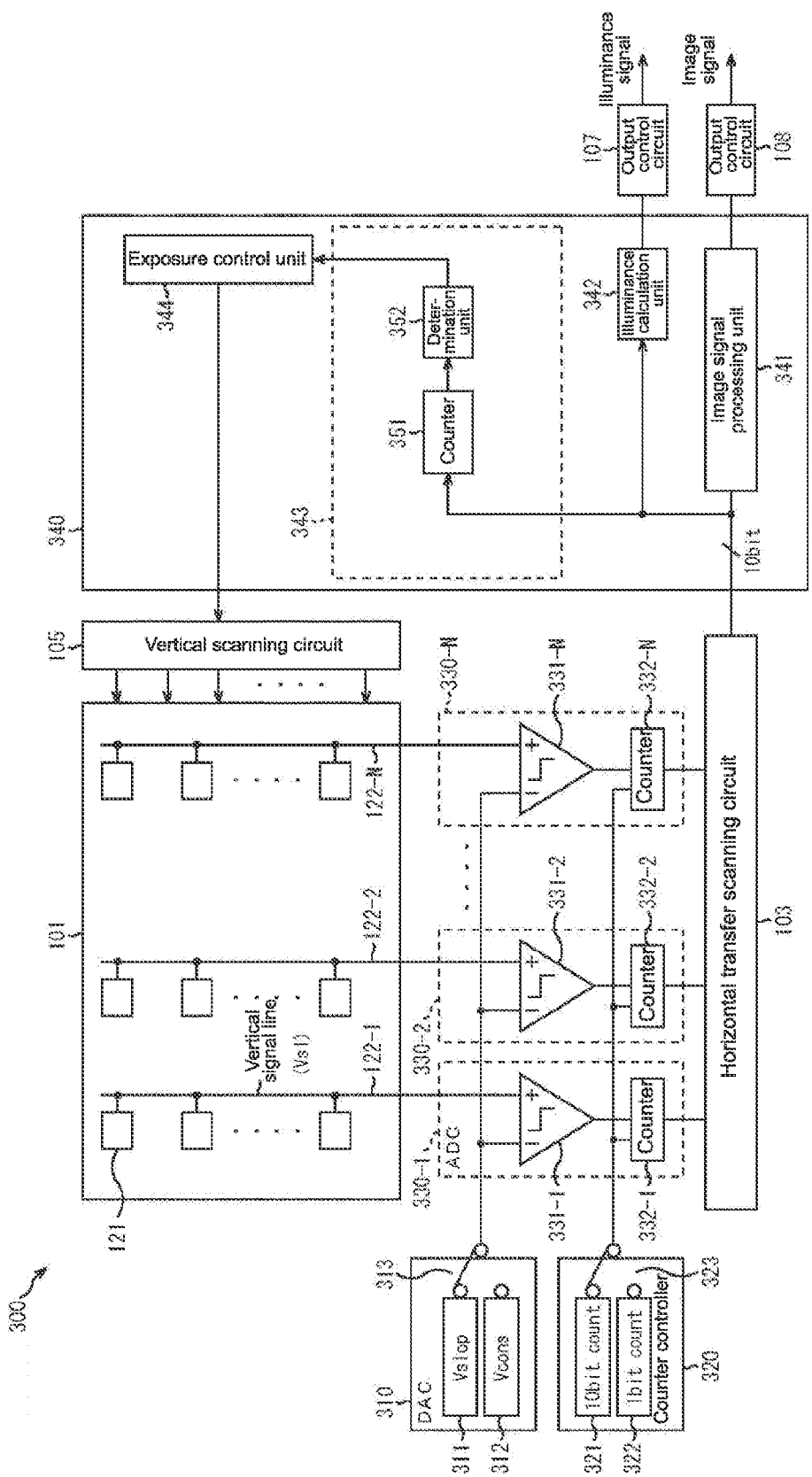
FIG. 10 is a diagram showing a configuration of the solid-state imaging device according to the third embodiment.

When an image signal is output from the output control circuit 108 of the solid-state imaging device 300, as shown in FIG. 10, the switch 313 of the DAC 310 is connected to the Vslop 311. Further, as shown in FIG. 10, the switch 323 of the counter controller 320 is connected to the 10-bit count 321.

When an image signal is generated, a signal of the reference voltage Vramp described above with reference to FIG. 2 is generated from the Vslop 311 of the DAC 310 and is supplied to comparators 331-1 to 331-N of ADCs 330-1 to 330-N. Further, a control signal for instructing to perform a 10-bit output is supplied from the 10-bit count 321 of the counter controller 320 to counters 332-1 to 332-N of the ADCs 330-1 to 330-N.

Otherwise, when an illuminance signal is output from the output control circuit 107 of the solid-state imaging device 300, as shown in FIG. 9, the switch 313 of the DAC 301 is connected to the Vcons 312. Further, as shown in FIG. 9, the switch 323 of the counter controller 320 is connected to the 1-bit count 322.

When the illuminance signal is generated, a constant voltage Vcons is generated from the Vcons 312 of the DAC 310 and supplied to the comparators 331-1 to 331-N of the ADCs 330-1 to 330-N. Further, a control signal for instructing to perform a 1-bit output is supplied from the 1-bit count 322 of the counter controller 320 to the counters 332-1 to 332-N of the ADCs 330-1 to 330-N.

The following description relates to the generation of the illuminance signal, and hence the description will be continued with reference to the block diagram of the solid-state imaging device 300 shown in FIG. 9. Here, it is assumed that, during the first exposure time (long-term storage), the long-term stored data item for the illuminance calculation is obtained and the switch 313 and the switch 323 are connected in the state as shown in FIG. 9.

As an operation of the ADC 330 during the first exposure time (long-term storage), the constant voltage Vcons from the Vcons 312 of the DAC 310 is input to one side of the comparator 331 and an input voltage Vs1 from the unit pixels 121 via the vertical signal line 122 is input to the other side. The constant voltage Vcons is used as a reference voltage and the reference voltage is used as a threshold value. Further, the reference voltage is an analog voltage corresponding to the reference voltage Vref (digital) of the digital comparator 212 of the saturation determination unit 205 shown in FIG. 5.

In the ADC 330, the comparator 331 compares a reference voltage (low voltage Vcons) with the input voltage Vs1. Reversion of an output signal of the comparator 331 is used as a trigger, and, in response to the reversed output signal of the comparator 331, a digital code generated in the 1-bit count 322 (e.g., 1 if input voltage is larger than reference voltage and 0 if input voltage is smaller than reference voltage) is latched into the counter 332 (latch unit).

The latched digital code is transferred by the horizontal transfer scanning circuit 103 to the arithmetic control unit 340 for each column. Due to operations of the DAC 310, the counter controller 320, and the ADC 330, an output corresponding to the output from the digital comparator 212 obtained by the counter 213 (FIG. 5) according to the second embodiment is obtained as an output of the horizontal transfer scanning circuit 103.

With such a configuration, the arithmetic control unit 340 does not need to include the digital comparator 212 and has a configuration as shown in FIG. 9. The arithmetic control unit 340 includes an image signal processing unit 341, an illuminance calculation unit 342, a saturation determination unit 343, and an exposure control unit 344. The saturation determination unit 343 includes a counter 351 and a determination unit 352.

The arithmetic control unit 340 is supplied with a digital code having a value of 1 or 0 from the horizontal transfer scanning circuit 103. The digital code is supplied to the counter 351 of the saturation determination unit 343. The counter 351 counts the number of data items with the value of the digital code being 1. The determination unit 352 determines whether or not the count value counted by the counter 351 is equal to or larger than the threshold value.

The processing of the counter 351 and the determination unit 352 is basically the same as the processing of the counter 213 and the determination unit 214 in FIG. 5. That is, if the count value counted by the counter 351 is equal to or larger than a set threshold value, the determination unit 352 determines that the saturation occurs due to the long-term storage exposure.

A determination result of the determination unit 352 is supplied to the exposure control unit 344. If the determination unit 352 determines that the saturation occurs due to the long-term storage exposure, the exposure control unit 344 selects a short-term storage exposure control and starts exposure.

Otherwise, if the count value counted by the counter 351 is smaller than the set threshold value, the determination unit 352 determines that the saturation does not occur due to the long-term storage exposure, and the exposure control unit 344 selects a long-term storage exposure control and starts exposure.

Figure 11:
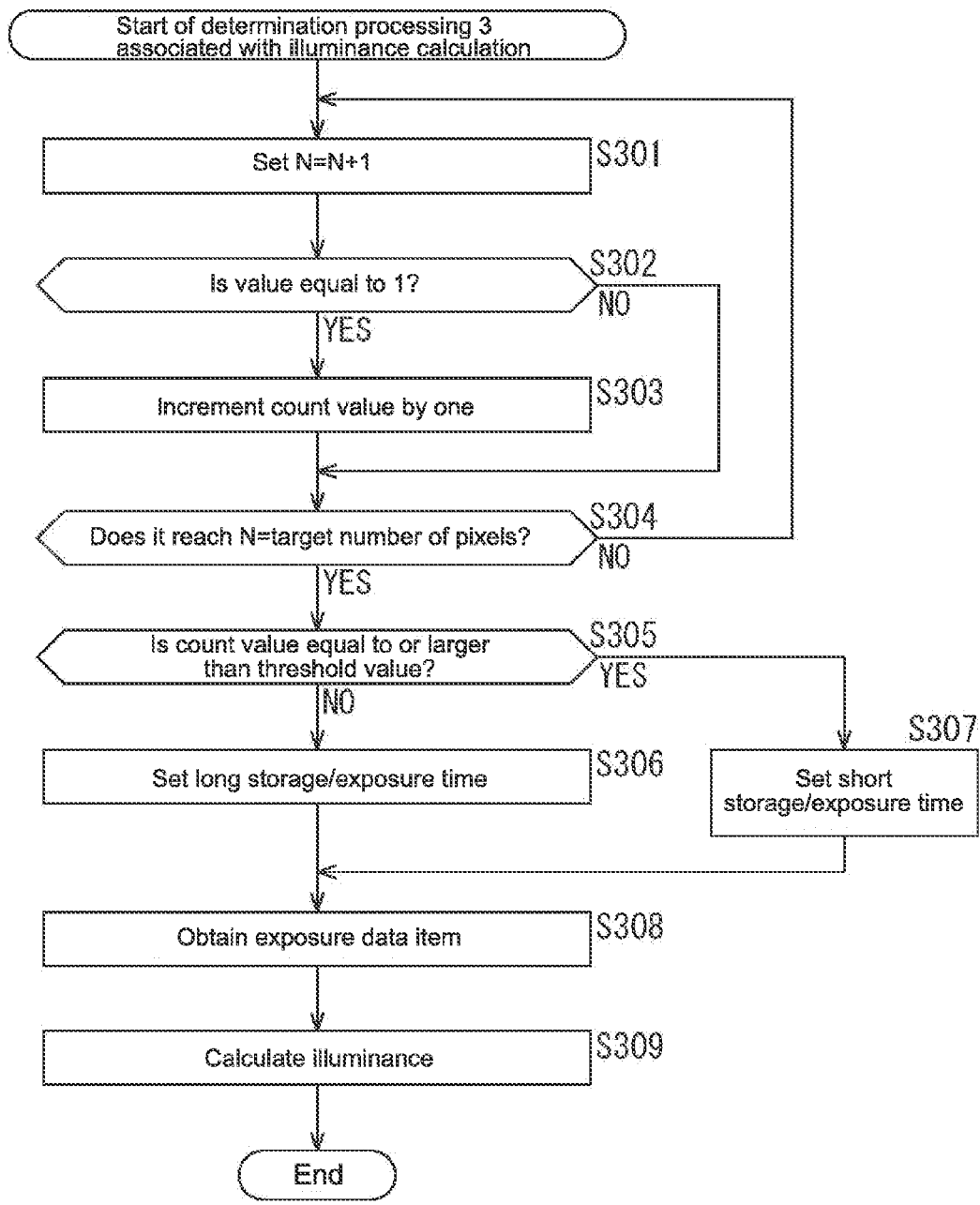
FIG. 11 is a flowchart for describing determination processing associated with illuminance calculation in the third embodiment.

Such processing associated with the calculation of the illuminance in the solid-state imaging device 300 will be described in detail with reference to a flowchart of FIG. 11. In Step S301, the counter 351 sets N=N+1. An initial value of N is 0, which is a value for identifying a pixel to be processed (digital code to be processed). For example, numbers are assigned to pixels from an upper left pixel to a lower right pixel of the pixel unit 101. When the value of N becomes one of the numbers, a digital code of the pixel is set as a processing target.

In Step S302, whether or not a value of an Nth pixel is 1 is determined. The counter 351 is supplied from the horizontal transfer scanning circuit 103 to the digital code having a value of 1 or 0. If the supplied digital code is 1, the counter 351 increments a counter value by one. If the supplied digital code is 0, the processing transitions to a subsequent digital code without counting.

That is, in Step S302, if it is determined that the value of the digital code as the processing target is 1, the processing proceeds to Step S303 and the counter 351 updates a value to a value obtained by incrementing the counter value by one.

After processing in Step S303 or in Step S302, if it is determined that the value of the digital code as the processing target is not 1, the processing proceeds to Step S304. In Step S304, whether or not N reaches the number of pixels as the processing target is determined. In Step S304, if it is determined that N=target number of pixels is not established, the processing returns to Step S301 and the subsequent processing is repeated. That is, a subsequent pixel is set to be a pixel as the processing target and whether or not a value of a digital code from the pixel is 1 is determined.

Otherwise, in Step S304, if it is determined that N=target number of pixels is established, the processing proceeds to Step S305. In Step S305, the determination unit 352 determines whether or not a count value counted by the counter 351 is equal to or larger than the threshold value. The threshold value in the determination unit 352 is set to be, for example, the number of pixels as the processing target, in other words, 5% of the target number of pixels when it is determined that N=target number of pixels is established by the processing in Step S304.

In Step S305, if it is determined that the count value is equal to or larger than the threshold value, the processing proceeds to Step S306. In Step S306, a long storage/exposure time is set. In this case, it is determined that the saturation occurs due to the long-term exposure, and hence the processing proceeds to Step S306 and the long storage/exposure time is set.

The determination unit 352 notifies the exposure control unit 344 of the selection of the long storage/exposure time. The exposure control unit 344 controls read-out by the vertical scanning circuit 105 for the long storage/exposure time. Thus, the illuminance calculation unit 342 is supplied with a long-term stored data item obtained when exposure is performed for the long storage/exposure time. In Step S308, the illuminance calculation unit 342 obtains the long-term stored data item. Then, in Step S309, the illuminance calculation unit 342 calculates an illuminance based on Expression (1) above and outputs the illuminance to the output control circuit 107.

Otherwise, in Step S305, if it is determined that the count value is equal to or larger than the threshold value or if it is determined that the saturation occurs due to the long-term exposure, the processing proceeds to Step S307. In Step S307, a short storage/exposure time is set.

The determination unit 352 notifies the exposure control unit 344 of the selection of the short storage/exposure time. The exposure control unit 344 controls read-out by the vertical scanning circuit 105 for the short storage/exposure time. Thus, the illuminance calculation unit 342 is supplied with a short-term stored data item obtained when exposure is performed for the short storage/exposure time. In Step S308, the illuminance calculation unit 342 obtains the short-term stored data item. Then, in Step S309, the illuminance calculation unit 342 calculates an illuminance based on Expression (1) above and outputs the illuminance to the output control circuit 107.

Figure 12:
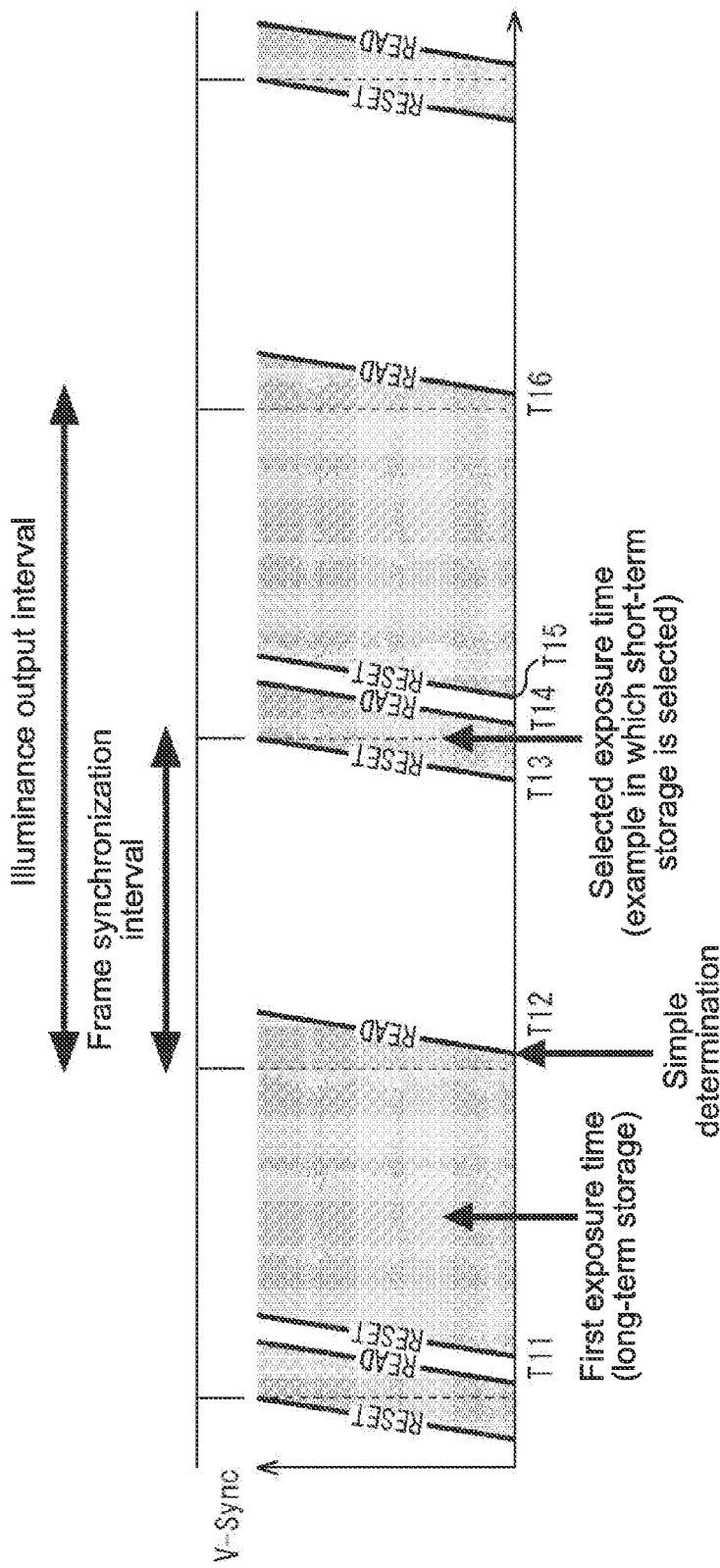
FIG. 12 is a diagram for describing determination processing associated with the illuminance calculation.

Here, the processing associated with the calculation of the illuminance in the solid-state imaging device 300 will be described again with reference to FIG. 12. A point of time T11 to a point of time T12 correspond to the first exposure time (long storage/exposure time). A digital code obtained when exposure is performed for the first exposure time is obtained by the counter 351 (FIG. 9) repeating the processing of Steps S301 to S304.

At the point of time T12, a determination is made by the determination unit 352. This processing corresponds to processing in Step S305. As a result of making the determination at the point of time T12, which of the long storage/exposure time and the short storage/exposure time is to be set is determined. If the short storage/exposure time is set (if processing in Step S307 is executed), the data item obtained when exposure is performed for the second exposure time (short storage time) from a point of time T13 to a point of time T14 is obtained.

If the determination unit 214 determines that the long storage time is to be set, the long storage/exposure time is set in the exposure control unit 344 and the long-term stored data item is supplied to the illuminance calculation unit 342 (corresponding to processing in Step S306). The long-term stored data item supplied to the illuminance calculation unit 342 at this time may be a long-term stored data item obtained during the first exposure time from the point of time T11 to the point of time T12 or may be a long-term stored data item obtained during the first exposure time from a point of time T15 to a point of time T16.

The illuminance calculation unit 342 calculates an illuminance from the long-term stored data item or the short-term stored data item and outputs the illuminance (corresponding to processing in Steps S308 and S309). An output of the illuminance is performed at, for example, the point of time T16. At the point of time T16, both of the long-term stored data item and the short-term stored data item can be obtained, and hence an illuminance can be calculated even if either one of the long-term stored data item and the short-term stored data item is selected.

Note that, if the long storage/exposure time is set, the obtention of the short-term stored data item performed between the point of time T13 and the point of time T14 may be omitted. Alternatively, if the long storage/exposure time is set and the long-term stored data item obtained between the point of time T11 and the point of time T12 is used for the illuminance calculation, an illuminance may be calculated and output between the point of time T12 and the point of time T13.

In this manner, the reference voltage (first threshold value) is supplied to the comparator 331 of the ADC 330. In the counter 332, the digital code indicating whether or not it exceeds the first threshold value is generated and counting is performed based on the digital code in the counter 351 of the saturation determination unit 343. Then, whether or not the count value counted by the counter 351 exceeds the second threshold value is determined by the determination unit 352. Thus, whether or not the saturation state occurs is determined.

By determining the saturation state in this manner, an illuminance can be calculated with higher accuracy. Also in this case, as described above with reference to FIGS. 8A to 8C, an illuminance can be calculated without using a data item obtained when the saturation occurs and the illuminance can be calculated with high accuracy. Further, according to such a system, the ADC operation that consumes large power is performed only one time during either one of the long-term storage and the short-term storage, and hence low power consumption can be achieved.

Although two data items of the long-term stored data item and the short-term stored data item are used in the above description, a plurality of data items may be used. In this case, the exposure control unit 344 is configured to be capable of controlling a plurality of exposure times and the counter 351 is configured to obtain digital codes from data items when a control during one exposure time of the plurality of exposure times is performed.

The digital code from the horizontal transfer scanning circuit 103 is supplied to the counter 351. As in the above-mentioned case, the number of digital codes satisfying a predetermined condition, for example, a condition that the value is 1 is counted. Based on the count value, the determination unit 352 determines whether or not saturation occurs due to the exposure time obtained when the digital code is obtained.

Depending on the determination result, for example, if it is determined that the saturation occurs, such that an illuminance is calculated using a data item obtained during a different exposure time, the different exposure time is set in the exposure control unit 344 and a storage data item obtained during the different exposure time is configured to be output to the illuminance calculation unit 342.

In this manner, the exposure control unit 344 may be capable of controlling a plurality of exposure times and the determination unit 352 may be configured to determine whether or not saturation occurs using at least one data item of the plurality of data items obtained from the plurality of exposure times. Further, if it is determined that the saturation occurs, a data item obtained during a different exposure time, which is assumed to have been obtained without saturation, (data item obtained during exposure time different from exposure time when data item used for determination is obtained) may be supplied to the illuminance calculation unit 342 and an illuminance may be calculated.

Fourth Embodiment

Figure 13:
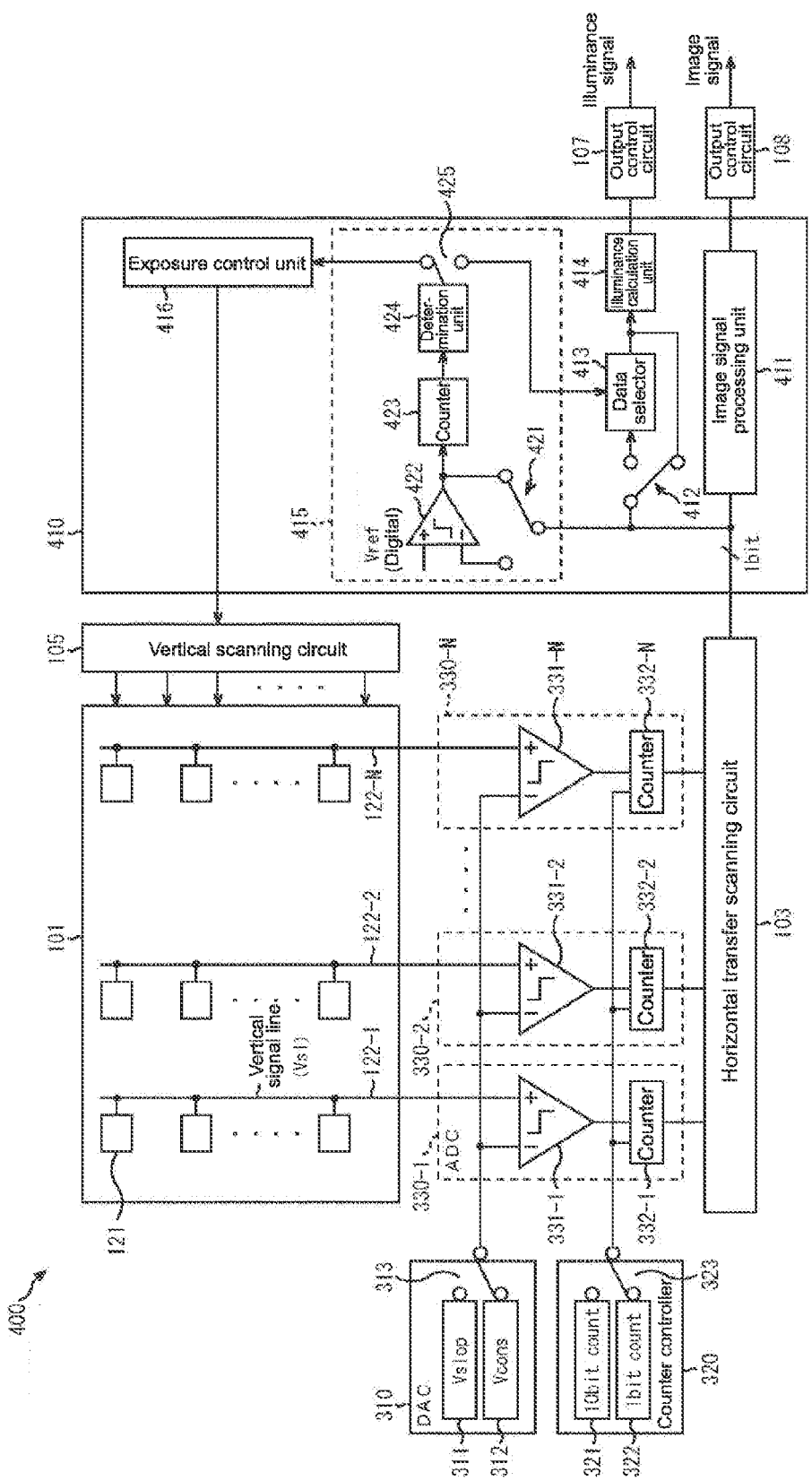
FIG. 13 is a diagram showing a configuration of a solid-state imaging device according to a fourth embodiment.

FIG. 13 is a diagram showing a configuration of a solid-state imaging device 400 according to a fourth embodiment. The solid-state imaging device 400 shown in FIG. 13 has a configuration obtained by combining the solid-state imaging device 200 shown in FIG. 5 with the solid-state imaging device 300 shown in FIG. 9.

In the solid-state imaging device 400 shown in FIG. 13, a pixel unit 101, a horizontal transfer scanning circuit 103, a vertical scanning circuit 105, an output control circuit 107, an output control circuit 108, a DAC 310, a counter controller 320, and an ADC 330 are the same configuration as those of the solid-state imaging device 300 shown in FIG. 9, and hence will be denoted by the same reference symbols and descriptions thereof will be omitted.

A basic configuration of an arithmetic control unit 410 is identical to that of the arithmetic control unit 201 shown in FIG. 5. However, the arithmetic control unit 410 is different from the arithmetic control unit 201 in that the arithmetic control unit 410 includes a switch that selects generating a value counted by a counter 423 in the arithmetic control unit 410 as in the arithmetic control unit 201 shown in FIG. 5 or supplying a value as a digital code from the ADC 330 as in the arithmetic control unit 340 shown in FIG. 9.

Specifically, an arithmetic control unit 401 includes an image signal processing unit 411, a switch 412, a data selector 413, an illuminance calculation unit 414, a saturation determination unit 415, and an exposure control unit 416. The saturation determination unit 415 includes a switch 421, a digital comparator 422, the counter 423, a determination unit 424, and a switch 425.

The switch 412 of the arithmetic control unit 410 is connected to the illuminance calculation unit 414 when receiving a digital code from the ADC 330 and calculating an illuminance. Further, the switch 412 of the arithmetic control unit 410 is connected to the data selector 413 when obtaining a long-term stored data item or a short-term stored data item and calculating an illuminance based on a determination result from the determination unit 424.

The switch 425 of the saturation determination unit 415 is connected to the exposure control unit 416 when receiving a digital code from the ADC 330 and calculating an illuminance. Further, the switch 425 of the saturation determination unit 415 is connected to the data selector 413 when obtaining a long-term stored data item or a short-term stored data item and calculating an illuminance based on a determination result from the determination unit 424.

In this manner, the solid-state imaging device 400 shown in FIG. 13 is capable of calculating an illuminance by switching between an illuminance calculation method by the solid-state imaging device 200 shown in FIG. 5 (hereinafter, referred to as first illuminance calculation) and an illuminance calculation method by the solid-state imaging device 300 shown in FIG. 9 (hereinafter, referred to as second illuminance calculation).

In the first illuminance calculation, the illuminance calculation is performed as described above with reference to FIG. 5 to FIGS. 8A to 8C. In the second illuminance calculation, the illuminance calculation is performed as described above with reference to FIG. 9 to FIG. 12. Which of the first illuminance calculation and the second illuminance calculation is to be used for performing the illuminance calculation can be determined based on whether or not a predetermined condition is satisfied. The predetermined condition is, for example, shutter speed and the shutter speed changes between the first illuminance calculation and the second illuminance calculation.

Also as in the solid-state imaging device 400 shown in FIG. 13, the illuminance is calculated by the first illuminance calculation or the second illuminance calculation, and hence it is possible to calculate an illuminance with higher accuracy as in the above-mentioned case.

<Application to Back Side Illumination>

Each of the solid-state imaging device 100 according to the first embodiment, the solid-state imaging device 200 according to the second embodiment, the solid-state imaging device 300 according to the third embodiment, and the solid-state imaging device 400 according to the fourth embodiment that are described above can be applied to a back-side-illumination imaging device. Now, a description will be added to the back-side-illumination imaging device.

Figure 14:
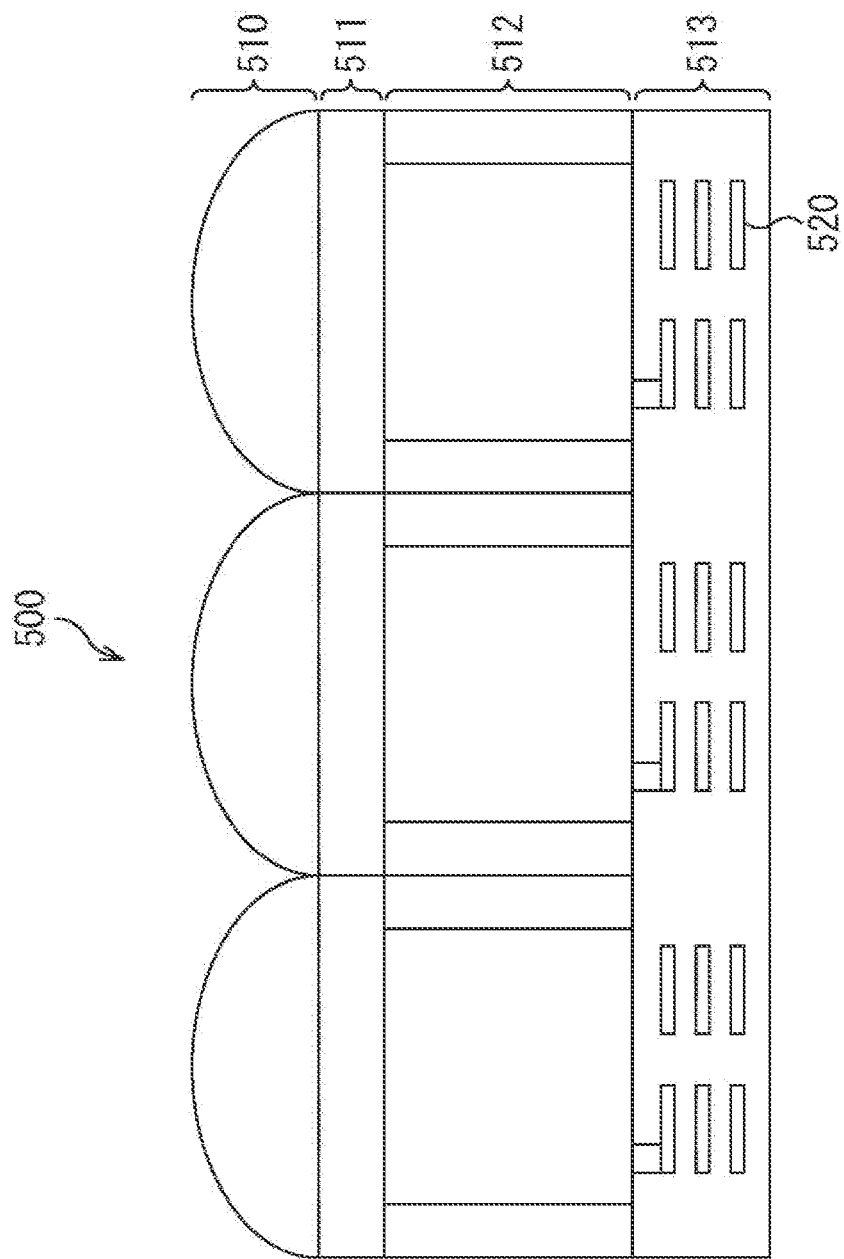
FIG. 14 is a diagram showing a configuration of a back-side-illumination solid-state imaging device.

FIG. 14 shows a configuration example of a back-side-illumination (BSI) CMOS-type solid-state imaging device. Here, portions corresponding to three pixels are extracted and shown. A solid-state imaging device 500 shown in FIG. 14 includes an on-chip micro lens 510, a color filter layer 511, a photodiode layer 512, and a signal wiring layer 513 that are stacked in this order from the upper side.

The on-chip micro lens 510 is an optical device for efficiently conducting light to the photodiode layer 512. The color filter layer 511 is a layer formed of organic molecules or pigments that selectively transmit, for example, visible wavelength components of three primary colors (e.g., red, blue, green, or the like).

The photodiode layer 512 is a photoelectric conversion layer that converts received light into charge. Further, in the photodiode layer 512, adjacent photodiodes are electrically isolated by an oxide film of STI (Shallow Trench Isolation) or the like or an EDI structure, a CION structure, or the like by implantation of impurities.

The signal wiring layer 513 is a layer in which wiring lines 520 for reading charge accumulated in the photodiode layer 512 are provided.

In this manner, in the solid-state imaging device 500, regarding the light focused by the on-chip micro lens 510, a desired wavelength component is selected by the color filter layer 511 and then the transmitted light reaches the photodiode layer 512. The transmitted light is photoelectrically converted by the photodiode layer 512. A carrier generated by the photoelectric conversion in the photodiode layer 512 is output to an outside of the solid-state imaging device 500 via the wiring lines 520 provided in the signal wiring layer 513, as an image signal.

The solid-state imaging devices 100, 200, 300, and 400 according to the first to fourth embodiments described above can be applied to the back-side-illumination solid-state imaging device 500 having the above-mentioned configuration.

<Configuration of Imaging Apparatus>

Figure 15:
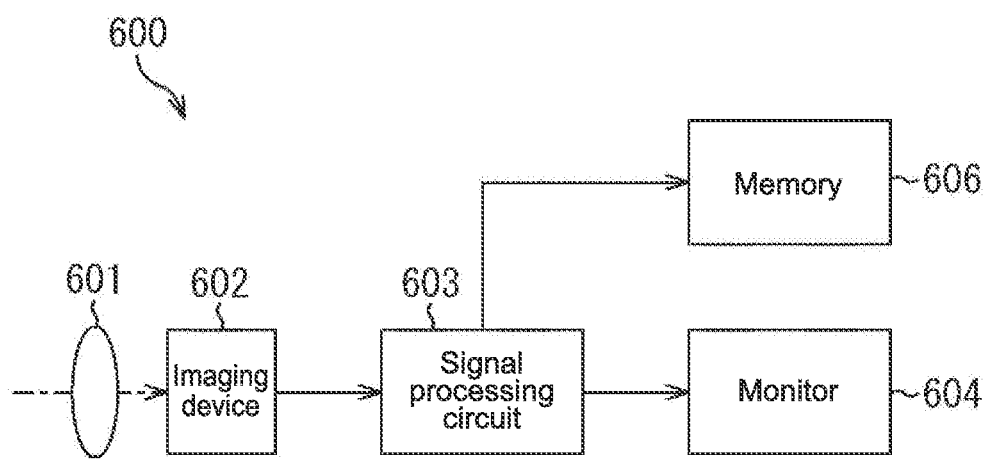
FIG. 15 is a diagram showing a configuration of an imaging apparatus.

The solid-state imaging devices 100, 200, 300, and 400 according to the first to fourth embodiments can form part of an imaging apparatus. FIG. 15 is a block diagram showing an exemplary configuration of the imaging apparatus.

As shown in FIG. 15, an imaging apparatus 600 includes an optical system 601, an imaging device 602, a signal processing circuit 603, a monitor 604, and a memory 606. The imaging apparatus 600 is capable of capturing still images and moving images. The optical system 601 includes a single lens or a plurality of lenses. The optical system 601 guides image light (incident light) from a subject to the imaging device 602 and forms an image on a light receiving surface (sensor unit) of the imaging device 602.

As the imaging device 602, the solid-state imaging device 100, 200, 300, or 400 including the pixel unit 101 having the above-mentioned configuration can be applied. Electrons are accumulated in the imaging device 602 for a predetermined period depending on the image formed on the light receiving surface via the optical system 601. A signal depending on the electrons accumulated in the imaging device 602 is supplied to the signal processing circuit 603.

The signal processing circuit 603 subjects signal charge output from the imaging device 602 to various types of signal processing. An image (image data item) obtained by the signal processing circuit 603 performing the signal processing is supplied to the monitor 604 and displayed or supplied to the memory 606 and stored (recorded).

When the solid-state imaging device 100, 200, 300, or 400 having the above-mentioned configuration is applied as part of the imaging device 602 or the signal processing circuit 603, the imaging apparatus 600 having the above-mentioned configuration can be controlled with an appropriate illuminance and an image quality is improved.

Further, the solid-state imaging devices 100, 200, 300, and 400 according to the first to fourth embodiments of the present disclosure can be employed for the above-mentioned back-side-illumination CMOS-type solid-state imaging device, a front-side-illumination CMOS-type solid-state imaging device, a CCD-type solid-state imaging device, and the like.

Further, the solid-state imaging devices 100, 200, 300, and 400 according to the first to fourth embodiments of the present disclosure can be installed into imaging apparatuses such as a digital still camera and a digital video camera as well as various electronic apparatuses such as a cellular phone terminal and a personal computer.

<Recording Medium>

The above-mentioned sequence of processing can be executed by hardware or software. If the sequence of processing is executed by software, programs configuring the software are installed into a computer. Here, the computer includes a computer incorporated in dedicated hardware and, for example, a generally-used personal computer that installs various programs to be able to execute various functions.

Figure 16:
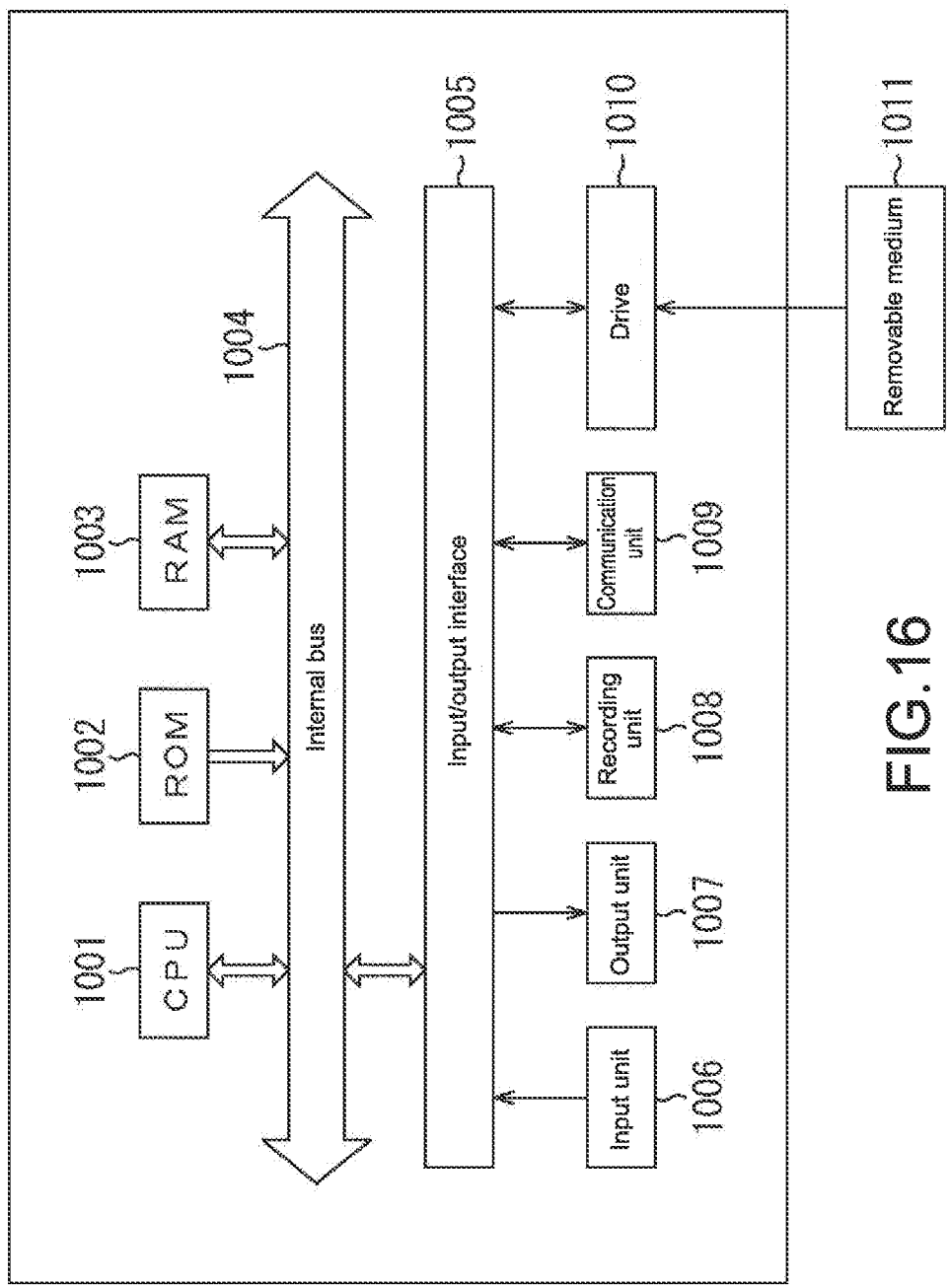
FIG. 16 is a diagram for describing a recording medium.

FIG. 16 is a block diagram showing an exemplary configuration of hardware of a computer that executes the above-mentioned sequence of processing by programs. In the computer, a CPU (Central Processing Unit) 1001, a ROM (Read Only Memory) 1002, and a RAM (Random Access Memory) 1003 are mutually connected via a bus 1004. To the bus 1004, further connected is an input/output interface 1005. To the input/output interface 1005, connected are an input unit 1006, an output unit 1007, a storage unit 1008, a communication unit 1009, and a drive 1010.

The input unit 1006 includes a keyboard, a mouse, a microphone, and the like. The output unit 1007 includes a display, a speaker, and the like. The storage unit 1008 includes a hard disk, a non-volatile memory, and the like. The communication unit 1009 includes a network interface and the like. The drive 1010 drives a removable medium 1011 such as a magnetic disc, an optical disc, a magneto-optical disk, and a semiconductor memory.

In the computer having the above-mentioned configuration, by the CPU 1001 loading programs stored in, for example, the storage unit 1008 into the RAM 1003 via the input/output interface 1005 and the bus 1004 and executing the programs, the above-mentioned sequence of processing is performed.

The programs executed by the computer (CPU 1001) can be provided being stored in the removable medium 1011, for example, as a package medium. Alternatively, the programs can be provided via a wired or wireless transmission medium such as a local area network, the Internet, and digital satellite broadcasting.

In the computer, by mounting the removable medium 1011 on the drive 1010, the programs can be installed into the storage unit 1008 via the input/output interface 1005. Alternatively, the programs can be received by the communication unit 1009 and installed into the storage unit 1008 via the wired or wireless transmission medium. Otherwise, the programs can be installed into the ROM 1002 or the storage unit 1008 in advance.

Note that the programs executed by the computer may be processed in time series based on the order described herein or processed at a necessary timing, for example, when a call is made.

Herein, the system means an entire apparatus including a plurality of apparatuses.

Note that the embodiments of the present disclosure are not limited to the above-mentioned embodiments and may be variously changed without departing from the gist of the present disclosure.

Note that the present disclosure may also take the following configurations.

(1) An imaging device, including:
an exposure control unit configured to control a plurality of exposure times;
a determination unit configured to determine whether or not saturation occurs using at least one data item of a plurality of data items obtained during the plurality of exposure times; and
an illuminance calculation unit configured to calculate, if the determination unit determines that the saturation occurs, an illuminance using a data item different from the at least one data item used in the determination.

(2) The imaging device according to Item (1), in which
the determination unit is configured to calculate an average value of the plurality of data items and determine, based on a comparison result between the average value and a threshold value, whether or not saturation occurs.

(3) The imaging device according to Item (1), in which
the determination unit is configured to calculate an average value of data items obtained during a first exposure time and determines, if the average value is equal to or larger than a threshold value, that the saturation occurs, and
the illuminance calculation unit is configured to obtain, if the determination unit determines that the saturation occurs, a data item obtained during a second exposure time shorter than the first exposure time, and calculate an illuminance.

(4) The imaging device according to any one of Items (1) to (3), further including:
a comparator configured to compare each of the plurality of data items with a first threshold value; and a count unit configured to count the number of comparison results of comparison results from the comparator, each of which satisfies a predetermined condition, in which the determination unit is configured to determine, based on a comparison result between a count value of the count unit and a second threshold value, whether or not saturation occurs.

(5) The imaging device according to any one of Items (1) to (3), further including:

a comparator configured to compare each of data items obtained during a first exposure time with a first threshold value; and a count unit configured to count the number of comparison results of comparison results from the comparator, in each of which the data item is equal to or larger than the first threshold value, in which the determination unit is configured to determine, if a count value of the count unit is equal to or larger than a second threshold value, that the saturation occurs, and the illuminance calculation unit is configured to obtain, if the determination unit determines that the saturation occurs, a data item obtained during a second exposure time shorter than the first exposure time, and calculate an illuminance.

(6) The imaging device according to any one of Items (1) to (5), further including:

a comparator configured to compare each of the plurality of data items with a first threshold value;

an output unit configured to output, as a comparison result from the comparator, codes each indicating a comparison result between the data item and the first threshold value; and a count unit configured to count the number of codes of the codes from the output unit, each of which satisfies a predetermined condition, in which the determination unit is configured to determine, based on a comparison result between a count value of the count unit and a second threshold value, whether or not saturation occurs.

(7) The imaging device according to any one of Items (1) to (5), further including:

a comparator configured to compare each of data items obtained during a first exposure time with a first threshold value;

an output unit configured to output, as a comparison result from the comparator, codes each indicating whether or not the data item is equal to or larger than the first threshold value; and a count unit configured to count the number of codes of the codes from the output unit, each of which indicates that the data item is equal to or larger than the first threshold value, in which the determination unit is configured to determine, if a count value of the count unit is equal to or larger than a second threshold value, that the saturation occurs, and the illuminance calculation unit is configured to obtain, if the determination unit determines that the saturation occurs, a data item obtained during a second exposure time shorter than the first exposure time, and calculate an illuminance.

(8) An imaging method for an imaging device including an exposure control unit, a determination unit, and an illuminance calculation unit, the method including:

controlling, by the exposure control unit, a plurality of exposure times;

determining, by the determination unit, whether or not saturation occurs using at least one data item of a plurality of data items obtained during the plurality of exposure times; and calculating, by the illuminance calculation unit, if the determination unit determines that the saturation occurs, an illuminance using a data item different from the at least one data item used in the determination.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a plurality of pixels that respectively output analog signals in response to incident light;
a plurality of signal lines respectively connected to the plurality of pixels;
a plurality of A/D converters respectively connected to the plurality of signal lines, the plurality of A/D converters configured to convert the analog signals into respective digital signals;
an illuminance calculation unit configured to calculate respective illuminances corresponding to the digital signals.

2. The imaging device according to claim 1, further comprising:
an exposure control unit configured to control a plurality of exposure times.

3. The imaging device according claim 1, further comprising:
a determination unit configured to convert a determination signal and output the determination signal to the illuminance calculation unit.

4. The imaging device according to claim 3, wherein the determination unit compares at least one of the digital signals and a threshold value to determine whether or not saturation occurs.

5. The imaging device according to claim 4, wherein the determination unit is configured to calculate an average value of at least some of the digital signals and determine, based on a comparison result between the average value and the threshold value, whether or not saturation occurs.

6. The imaging device according to claim 4, wherein the determination unit is configured to calculate an average value of at least some of the digital signals obtained during a first exposure time and to determine, if the average value is equal to or larger than the threshold value, that the saturation occurs.

7. The imaging device according to claim 6, wherein the illuminance calculation unit is configured to obtain, if the determination unit determines that the saturation occurs, at least one of the digital signals obtained during a second exposure time shorter than the first exposure time, and to calculate therefrom a corresponding illuminance.

8. The imaging device according to claim 3, further comprising:
at least one comparator configured to compare the digital signals with a first threshold value; and
a count unit configured to count a number of comparison results from the comparator, each of which satisfies a predetermined condition,
wherein the determination unit is configured to determine, based on a comparison result between a count value of the count unit and a second threshold value, whether or not saturation occurs.

9. The imaging device according to claim 3, further comprising:

at least one comparator configured to compare the digital signals obtained during a first exposure time with a first threshold value; and a count unit configured to count a number of comparison results from the comparator, in each of which a given one of the digital signals is equal to or larger than the first threshold value, wherein the determination unit is configured to determine, if a count value of the count unit is equal to or larger than a second threshold value, that the saturation occurs, and the illuminance calculation unit is configured to obtain, if the determination unit determines that the saturation occurs, at least one of the digital signals during a second exposure time shorter than the first exposure time, and to calculate an illuminance.

10. The imaging device according to claim 3, further comprising:

at least one comparator configured to compare the digital signals with a first threshold value;

an output unit configured to output, as a comparison result from the comparator, codes respectively indicating a comparison result between the digital signals and the first threshold value; and a count unit configured to count a number of codes of the codes from the output unit, each of which satisfies a predetermined condition, wherein the determination unit is configured to determine, based on a comparison result between a count value of the count unit and a second threshold value, whether or not saturation occurs.

11. The imaging device according to claim 3, further comprising:

at least one comparator configured to compare the digital signals obtained during a first exposure time with a first threshold value;

an output unit configured to output, as a comparison result from the comparator, codes respectively indicating whether or not the digital signals are equal to or larger than the first threshold value; and a count unit configured to count a number of codes of the codes from the output unit, each of which indicates that a given one of the digital signals is equal to or larger than the first threshold value, wherein the determination unit is configured to determine, if a count value of the count unit is equal to or larger than a second threshold value, that the saturation occurs, and the illuminance calculation unit is configured to obtain, if the determination unit determines that the saturation occurs, at least one of the digital signals obtained during a second exposure time shorter than the first exposure time, and calculate an illuminance.

* * * * *